United States Patent
Ikenaga

(10) Patent No.: US 11,462,429 B2
(45) Date of Patent: Oct. 4, 2022

(54) VAPOR DEPOSITION MASK AND METHOD FOR MANUFACTURING SAME, VAPOR DEPOSITION MASK DEVICE AND METHOD FOR MANUFACTURING SAME, INTERMEDIATE, VAPOR DEPOSITION METHOD, AND METHOD FOR MANUFACTURING ORGANIC EL DISPLAY DEVICE

(71) Applicant: Dai Nippon Printing Co., Ltd., Tokyo (JP)

(72) Inventor: Chikao Ikenaga, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 177 days.

(21) Appl. No.: 16/750,364

(22) Filed: Jan. 23, 2020

(65) Prior Publication Data
US 2020/0273735 A1    Aug. 27, 2020

(30) Foreign Application Priority Data

Jan. 29, 2019   (JP) .............................. JP2019-013549
Dec. 25, 2019   (JP) .............................. JP2019-235052

(51) Int. Cl.
*H01L 21/68*      (2006.01)
*C23C 14/04*      (2006.01)
*H01L 51/56*      (2006.01)
*H01L 51/00*      (2006.01)

(52) U.S. Cl.
CPC .......... *H01L 21/682* (2013.01); *C23C 14/042* (2013.01); *H01L 51/0011* (2013.01); *H01L 51/56* (2013.01)

(58) Field of Classification Search
CPC ..... C23C 14/042; C23C 14/24; C23C 14/044; C23C 16/042; H01L 51/0011; H01L 21/308; H01L 21/682
See application file for complete search history.

(56) References Cited

U.S. PATENT DOCUMENTS

| | | | | |
|---|---|---|---|---|
| 8,962,360 | B2* | 2/2015 | Chang | H01L 51/56 |
| | | | | 257/E21.525 |
| 10,437,144 | B2* | 10/2019 | Zhang | C23C 14/044 |
| 10,465,277 | B2* | 11/2019 | Xu | C23C 14/042 |
| 10,627,714 | B2* | 4/2020 | Ji | G03F 1/42 |
| 10,873,028 | B2* | 12/2020 | Kim | H01L 51/0011 |

(Continued)

FOREIGN PATENT DOCUMENTS

| | | |
|---|---|---|
| JP | 2015-178662 A1 | 10/2015 |
| JP | 2016-108578 A1 | 6/2016 |
| JP | 2018-095958 A1 | 6/2018 |

OTHER PUBLICATIONS

Extended European Search Report (Application No. 20154001.0) dated Jun. 4, 2020.

*Primary Examiner* — Jaehwan Oh
(74) *Attorney, Agent, or Firm* — Burr & Brown, PLLC

(57) ABSTRACT

A vapor deposition mask includes a mask main body and a support joined to the mask main body. The mask main body has a first alignment mark whereas the support has a second alignment mark. The first alignment mark and the second alignment are provided at such positions as to overlap with each other in plan view, and either one of the alignment marks is larger than the other of the alignment marks.

11 Claims, 24 Drawing Sheets

(56) References Cited

U.S. PATENT DOCUMENTS

| | | | |
|---|---|---|---|
| 10,982,314 B2* | 4/2021 | Lin | B05D 1/32 |
| 2014/0370633 A1* | 12/2014 | Chang | C23C 14/12 |
| | | | 438/46 |
| 2018/0015493 A1* | 1/2018 | Kobayashi | H01L 51/5012 |
| 2018/0026189 A1* | 1/2018 | Kim | C23C 14/12 |
| | | | 438/401 |
| 2018/0196343 A1* | 7/2018 | Ji | B05B 12/20 |
| 2018/0245198 A1* | 8/2018 | Xu | C23C 14/042 |
| 2019/0378983 A1* | 12/2019 | Kim | H01L 51/56 |
| 2019/0378984 A1* | 12/2019 | Nakamura | H01L 51/5012 |

* cited by examiner

VAPOR DEPOSITION MASK AND METHOD FOR MANUFACTURING SAME, VAPOR DEPOSITION MASK DEVICE AND METHOD FOR MANUFACTURING SAME, INTERMEDIATE, VAPOR DEPOSITION METHOD, AND METHOD FOR MANUFACTURING ORGANIC EL DISPLAY DEVICE

CROSS-REFERENCE TO RELATED APPLICATION

This application is based upon and claims the benefit of priority of the prior Japanese Patent Application No. 2019-013549, filed on Jan. 29, 2019 and the prior Japanese Patent Application No. 2019-235052, filed on Dec. 25, 2019, the entire contents of which are incorporated herein by reference.

BACKGROUND OF THE INVENTION

Field of the Invention

The embodiments discussed herein are related to a vapor deposition mask and a method for manufacturing the same, a vapor deposition mask device and a method for manufacturing the same, an intermediate, a vapor deposition method, and a method for manufacturing an organic EL display device.

Background Art

In regard of display devices for use in portable devices, such as smart phones and tablet PCs, a high definition, for example, a pixel density of equal to or more than 400 ppi, is being demanded in recent years. In addition, with respect to the portable devices as well, there are increasing demands for coping with ultra high definition (UHD); in this case, for example, a display device pixel density of equal to or more than 800 ppi is demanded.

Among the display devices, an organic electroluminescent (EL) display device is gaining attention because of its good response, low electric power consumption, and high contrast. As a method for forming pixels of the organic EL display device, there has been known a method in which pixels are formed in a desired pattern by use of a vapor deposition mask including through-holes arranged in a desired pattern (see Japanese Patent Laid-open No. 2015-178662). Specifically, a vapor deposition step of first putting a substrate (an organic EL substrate) for the organic EL display device into a vapor deposition device, then putting a vapor deposition mask into close contact with the organic EL substrate in the vapor deposition device, and finally vapor-depositing an organic material onto the organic EL substrate is conducted.

SUMMARY OF THE INVENTION

Incidentally, in manufacturing such a vapor deposition mask, it has been proposed to reinforce the vapor deposition mask by stacking an intermediate of the vapor deposition mask on a support for the purpose of enhancing strength. In this case, it is demanded that the intermediate be joined to the opening of the support accurately.

The vapor deposition mask of the present disclosure includes a mask main body and a support joined to the mask main body. The mask main body has a first alignment mark, whereas the support has a second alignment mark, and the first alignment mark and the second alignment mark are provided at such positions as to overlap with each other in plan view, and either one of the alignment marks is larger than the other of the alignment marks.

According to the present disclosure, an intermediate of a vapor deposition mask can be joined to a support accurately.

DETAILED DESCRIPTION OF THE INVENTION

Figure 1:
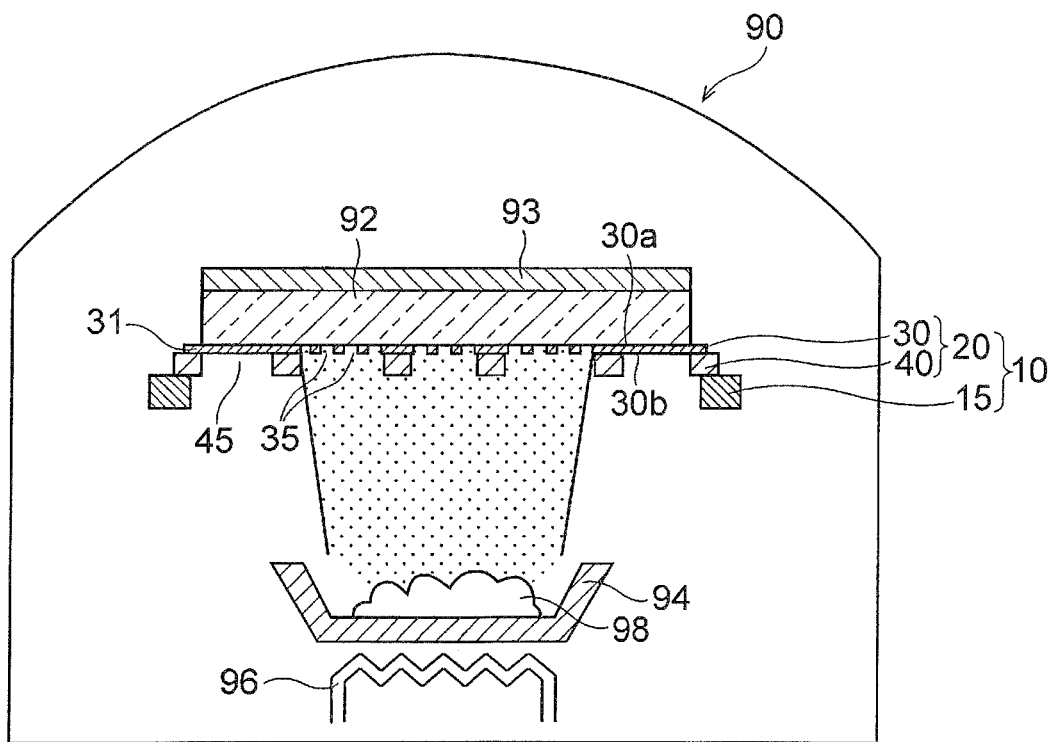
FIG. 1 is a diagram for explaining a vapor deposition device having a vapor deposition mask device and a vapor deposition method using the vapor deposition device.

In the present specification and drawings, unless specified otherwise, the terms meaning a substance constituting a base of a configuration, such as "substrate," "base material," "plate," "sheet," or "film," are not discriminated from one another, based on mere difference in name.

In the present specification and drawings, unless specified otherwise, the terms, length, angle values, and the like specifying the shape and geometric conditions and the degrees thereof, such as, "parallel" and "orthogonal," are not bound by their strict meanings and are construed including such ranges that similar functions can be expected.

In the present specification and drawings, unless specified otherwise, in the case where a configuration of a member, a region, or the like is "on" or "beneath," "on an upper side of" or "on a lower side of," or "over" or "under" another configuration of another member, another region, or the like, a case where one configuration is in direct contact with another configuration is included. Further, a case where other configuration is included between one configuration and another configuration, that is, a case where one configuration and another configuration are in indirect contact with each other, is also included. In addition, unless specified otherwise, "on," "on an upper side of," and "over" or "beneath," "on a lower side of," and "under" may be reversed in the upper and lower directions.

In the present specification and drawings, unless specified otherwise, the same parts or parts having similar functions are denoted by the same symbols or similar symbols, and repeated descriptions thereof may be omitted. Besides, dimensional ratios in the drawings may be different from actual ratios for convenience of explanation, and part of the configurations may be omitted from the drawings.

In the present specification and drawings, unless specified otherwise, one configuration may be combined with other configurations or modifications in such ranges as not to produce contradiction. In addition, other configurations as well as other configurations and modifications may be combined with each other in such ranges as not to produce contradiction. Besides, modifications may be combined with each other in such ranges as not to produce contradiction.

In the present specification and drawings, unless specified otherwise, in the case of disclosing a plurality of steps concerning a method such as a manufacturing method, between disclosed steps, another step or other steps yet to be disclosed may be carried out. In addition, the order of the disclosed steps may optionally be changed in such ranges as not to produce contradiction.

In the present specification and drawings, unless specified otherwise, the numerical value range expressed by use of a symbol "–" includes the numerical values before and after the symbol "–." For example, the numerical value range defined by the expression of "34-38 wt %" is coincident with the numerical value range defined by the expression of "not less than 34 wt % but not more than 38 wt %."

In the present specification and drawings, unless specified otherwise, in the embodiments herein, description will be made by taking an example concerning a vapor deposition mask used for patterning an organic material in a desired pattern on a substrate at the time of manufacturing an organic EL display device, and a manufacturing method for the vapor deposition mask. It is to be noted, however, that such an application is not limitative, and the embodiments may be applied to vapor deposition masks used for various purposes.

Embodiments of the present disclosure will be described in detail below referring to the drawings. Note that the following embodiments are merely embodiments of the present disclosure, and the present disclosure is not to be construed as limited to these embodiments.

According to a first mode of the present disclosure, there is provided a vapor deposition mask including:

a mask main body; and a support joined to the mask main body, in which the mask main body has a first alignment mark, whereas the support has a second alignment mark, and the first alignment mark and the second alignment mark are provided at such positions as to overlap with each other in plan view, and either one of the alignment marks is larger than the other of the alignment marks.

According to a second mode of the present disclosure, in the vapor deposition mask according to the first mode mentioned above, the mask main body may have a plating layer formed with a plurality of through-holes.

According to a third mode of the present disclosure, in the vapor deposition mask according to the first mode mentioned above, the mask main body may have a metallic layer and a resin mask stacked on each other.

According to a fourth mode of the present disclosure, in the vapor deposition mask according to each of the first to third modes mentioned above, the first alignment mark may be a through-hole formed in the mask main body.

According to a fifth mode of the present disclosure, in the vapor deposition mask according to each of the first to fourth modes mentioned above, the second alignment mark may be a through-hole formed in the support.

According to a sixth mode of the present disclosure, in the vapor deposition mask according to each of the first to fourth modes mentioned above, the second alignment mark may be a non-through-hole recessed to an intermediate position in a thickness direction of the support.

According to a seventh mode of the present disclosure, in the vapor deposition mask according to each of the first to sixth modes mentioned above, the support may include a first support substrate located on the mask main body side and a second support substrate located on the first support substrate, the second alignment mark may include a first portion of the first support substrate and a second portion of the second support substrate, and the first portion may be smaller than the second portion in plan view.

According to an eighth mode of the present disclosure, there is provided a vapor deposition mask device including:

the vapor deposition mask according to any one of the first to seventh modes mentioned above; and a frame joined to the support of the vapor deposition mask.

According to a ninth mode of the present disclosure, there is provided an intermediate including:

a substrate;

a mask main body joined to the substrate; and a support joined to the mask main body, in which the mask main body has a first alignment mark, whereas the support has a second alignment mark, and the first alignment mark and the second alignment mark are provided at such positions as to overlap with each other in plan view, and either one of the alignment marks is larger than the other of the alignment marks.

According to a tenth mode of the present disclosure, in the intermediate according to the ninth mode mentioned above, the mask main body may have a plating layer formed with a plurality of through-holes.

According to an eleventh mode of the present disclosure, in the intermediate according to the ninth mode mentioned above, the mask main body may have a metallic layer and a resin mask stacked on each other.

According to a twelfth mode of the present disclosure, in the intermediate according to each of the ninth to eleventh modes mentioned above, the first alignment mark may be a through-hole formed in the mask main body.

According to a thirteenth mode of the present disclosure, in the intermediate according to each of the ninth to eleventh modes mentioned above, the first alignment mark may be an island-like projection formed on the substrate.

According to a fourteenth mode of the present disclosure, in the intermediate according to each of the ninth to thirteenth modes mentioned above, the second alignment mark may be a through-hole formed in the support.

According to a fifteenth mode of the present disclosure, in the intermediate according to each of the ninth to thirteenth modes mentioned above, the second alignment mark may be a non-through-hole recessed to an intermediate position in a thickness direction of the substrate.

According to a sixteenth mode of the present disclosure, in the intermediate according to each of the ninth to fifteenth modes mentioned above, the support may include a first support substrate located on the mask main body side and a second support substrate located on the first support substrate, the second alignment mark may include a first portion of the first support substrate and a second portion of the second support substrate, and the first portion may be smaller than the second portion in plan view.

According to a seventeenth mode of the present disclosure, there is provided a method of manufacturing a vapor deposition mask, the method including:

preparing an intermediate including a substrate and a mask main body joined to the substrate; and joining the mask main body and a support to each other, in which the mask main body has a first alignment mark, whereas the support has a second alignment mark, the first alignment mark and the second alignment mark are provided at such positions as to overlap with each other in plan view, and either one of the alignment marks is larger than the other of the alignment marks, and in joining the mask main body and the support to each other, positioning of the mask main body and the support is performed by mutually aligning the positions of the first alignment mark and the second alignment mark.

According to an eighteenth mode of the present disclosure, there is provided a method of manufacturing a vapor deposition mask, the method including:

preparing the vapor deposition mask according to any one of the first to seventh modes mentioned above; and mounting a frame to the support of the vapor deposition mask.

According to a nineteenth mode of the present disclosure, there is provided a vapor deposition method for a vapor deposition material for vapor-depositing the vapor deposition material onto a substrate, the vapor deposition method including:

preparing the vapor deposition mask device according to the eighth mode mentioned above;

preparing the substrate;

disposing the substrate on the mask main body of the vapor deposition mask device; and vapor-depositing the vapor deposition material onto the substrate disposed on the mask main body.

According to a twentieth mode of the present disclosure, there is provided a method of manufacturing an organic EL display device, the method including:

forming a vapor deposition pattern on an object of vapor deposition by use of the vapor deposition device according to the eighth mode mentioned above.

According to a twenty-first mode of the present disclosure, there is provided a vapor deposition method for a vapor deposition material for vapor-depositing the vapor deposition material onto a substrate, the vapor deposition method including:

preparing the vapor deposition mask according to any one of the first to seventh modes mentioned above;

preparing the substrate;

disposing the substrate on the mask main body of the vapor deposition mask; and vapor-depositing the vapor deposition material onto the substrate disposed on the mask main body.

According to a twenty-second mode of the present disclosure, there is provided a method of manufacturing an organic EL display device, the method including forming a vapor deposition pattern on an object of vapor deposition by use of the vapor deposition mask according to any one of the first to seventh modes mentioned above.

Embodiments of the present disclosure will be described below referring to the drawings. The following drawings are schematic ones. Therefore, the sizes and shapes of parts are appropriately exaggerated for easy understanding. In addition, the present disclosure can be carried out with appropriate modifications within such ranges as not to depart from the technical idea of the disclosure. It is to be noted that in the drawings below, the same part is denoted by the same reference symbol, and detailed descriptions may partly be omitted. Moreover, the numerical values of sizes and the like and the material names of the parts described in the present specification are mere examples as the embodiments, and are not limitative, and thus can be used through appropriate selection.

First, a first embodiment will be described referring to FIGS. 1 to 21(E).

First, a vapor deposition device 90 for carrying out a vapor deposition treatment of vapor-depositing a vapor deposition material onto an object of vapor deposition will be described referring to FIG. 1. As depicted in FIG. 1, the vapor deposition device 90 may be provided therein with a vapor deposition source (for example, a crucible 94), a heater 96, and a vapor deposition mask device 10. Moreover, the vapor deposition device 90 may further be provided with evacuation means (not illustrated) for establishing a vacuum atmosphere in the inside of the vapor deposition device 90. The crucible 94 accommodates a vapor deposition material 98 such as an organic luminescent material. The heater 96 may heat the crucible 94 to evaporate the vapor deposition material 98 in the vacuum atmosphere. The vapor deposition mask device 10 may be disposed to face the crucible 94.

As illustrated in FIG. 1, the vapor deposition mask device 10 may include a vapor deposition mask 20, and a frame 15 joined to a support 40, described later, of the vapor deposition mask 20. The frame 15 may support the vapor deposition mask 20 in the state of pulling the vapor deposition mask 20 in plane directions of the latter such that the vapor deposition mask 20 would not be flexed. As depicted in FIG. 1, the vapor deposition mask device 10 may be disposed inside the vapor deposition device 90 in such a manner that the vapor deposition mask 20 faces a vapor deposition substrate (for example, an organic EL substrate) 92 as an object of vapor deposition on which to vapor-deposit the vapor deposition material 98.

As illustrated in FIG. 1, the vapor deposition mask device 10 may be provided with a magnet 93 disposed on a surface of the vapor deposition substrate 92 on the side that is opposite the side where the vapor deposition substrate 92 faces the vapor deposition mask 20. With the magnet 93 thus provided, the vapor deposition mask 20 can be drawn toward the magnet 93 side by a magnetic force, and the vapor deposition mask 20 can be put into close contact with the vapor deposition substrate 92.

Next, the vapor deposition mask 20 of the vapor deposition mask device 10 will be described. As depicted in FIG. 1, the vapor deposition mask 20 may include a mask main body 30 having a plating layer 31 formed with a plurality of first through-holes 35, and a support 40 which is joined to the mask main body 30 and which is formed with a plurality of second through-holes 45 overlapping with the first through-holes 35 in plan view.

As illustrated in FIG. 1, the mask main body 30 may have a first surface 30a and a second surface 30b constituting a surface on the side opposite to the first surface 30a. In the example illustrated, the mask main body 30 may be disposed between the vapor deposition substrate 92 and the crucible 94. The mask main body 30 may be used for vapor deposition of the vapor deposition material 98 onto the vapor deposition substrate 92, in the state of being supported in the vapor deposition device 90 in such a manner that its first surface 30a faces a lower surface of the vapor deposition substrate 92, in other words, its second surface 30b faces the crucible 94. In the vapor deposition device 90 depicted in FIG. 1, the vapor deposition material 98 evaporated from the crucible 94 and reaching the vapor deposition mask 20 from the second surface 30b side of the mask main body 30 is deposited on the vapor deposition substrate 92 by passing through the second through-holes 45 of the support 40 and the first through-holes 35 of the mask main body 30. As a result, a film of the vapor deposition material 98 can be formed on the surface of the vapor deposition substrate 92 in a desired pattern corresponding to the positions of the first through-holes 35 of the mask main body 30.

Figure 2:
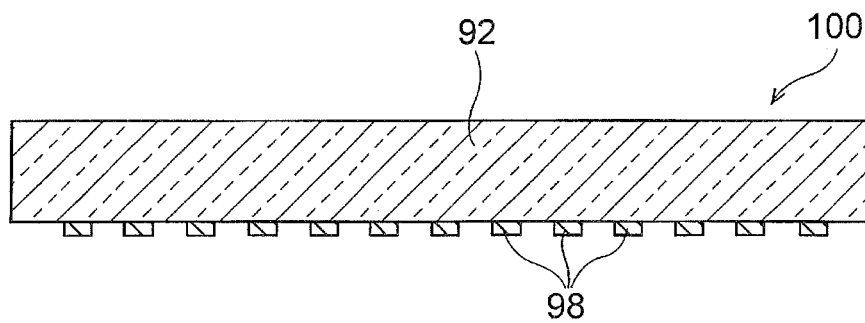
FIG. 2 is a sectional view depicting an example of an organic EL display device manufactured by the vapor deposition device illustrated in FIG. 1.

FIG. 2 is a sectional view depicting an organic EL display device 100 manufactured using the vapor deposition device 90 of FIG. 1. The organic EL display device 100 may include a vapor deposition substrate (organic EL substrate) 92 and pixels including a vapor deposition material 98 provided in a pattern.

In the case where color display by a plurality of colors is desired, the vapor deposition devices 90 each equipped with vapor deposition mask devices 10 corresponding to the colors are prepared, and the vapor deposition substrate 92 is sequentially put into the vapor deposition devices 90. As a result, for example, a red color organic luminescent material, a green color organic luminescent material, and a blue color organic luminescent material can sequentially be vapor-deposited on the vapor deposition substrate 92.

The vapor deposition treatment may be carried out in the inside of the vapor deposition device 90 where a high temperature atmosphere is present. In this case, the vapor deposition mask 20, the frame 15, and the vapor deposition substrate 92 held in the inside of the vapor deposition device 90 are also heated during the vapor deposition treatment. In this instance, the mask main body 30 and the support 40 of the vapor deposition mask 20, the frame 15 and the vapor deposition substrate 92 exhibit behaviors of dimensional changes based on their respective thermal expansion coefficients. In this case, if the mask main body 30, the support 40, and the frame 15 are largely different from the vapor deposition substrate 92 in thermal expansion coefficient, misregistration due to the differences in dimensional change is generated, resulting in lowered dimensional accuracy and positional accuracy for the vapor deposition material deposited on the vapor deposition substrate 92.

In order to solve such a problem, it is preferable that the thermal expansion coefficients of the mask main body 30, the support 40, and the frame 15 are comparable to the thermal expansion coefficient of the vapor deposition substrate 92. For example, in the case where a glass substrate is used as the vapor deposition substrate 92, a nickel-containing iron alloy can be used as a main material for the mask main body 30, the support 40, and the frame 15. For example, an iron alloy containing not less than 30 wt % but not more than 54 wt % of nickel can be used as the material of members constituting the mask main body 30, the support 40, and the frame 15. Specific examples of the nickel-containing iron alloy include an invar material containing not less than 34 wt % but not more than 38 wt % of nickel, a super invar material further containing cobalt in addition to not less than 30 wt % but not more than 34 wt % of nickel, and a low thermal expansion Fe—Ni based plated alloy containing not less than 38 wt % but not more than 54 wt % of nickel.

It is to be noted that, in the case where the temperatures of the mask main body 30, the support 40, the frame 15, and the vapor deposition substrate 92 do not reach a high temperature at the time of the vapor deposition treatment, the thermal expansion coefficients of the mask main body 30, the support 40, and the frame 15 are not necessarily required to be comparable to the thermal expansion coefficient of the vapor deposition substrate 92. In this case, materials other than the above-mentioned iron alloy may be used as the materials constituting the mask main body 30 and the support 40. For example, iron alloys other than the aforementioned nickel-containing iron alloy, such as a chromium-containing iron alloy, may be used. As the chromium-containing iron alloy, there can be used, for example, iron alloys called stainless steels. Moreover, alloys other than the iron alloys, such as nickel and nickel-cobalt alloys, may also be used.

Next, the mask main body 30 and the support 40 of the vapor deposition mask 20 as well as the frame 15 will be described in further detail, referring to FIGS. 1 and 3 to 7.

Figure 3:
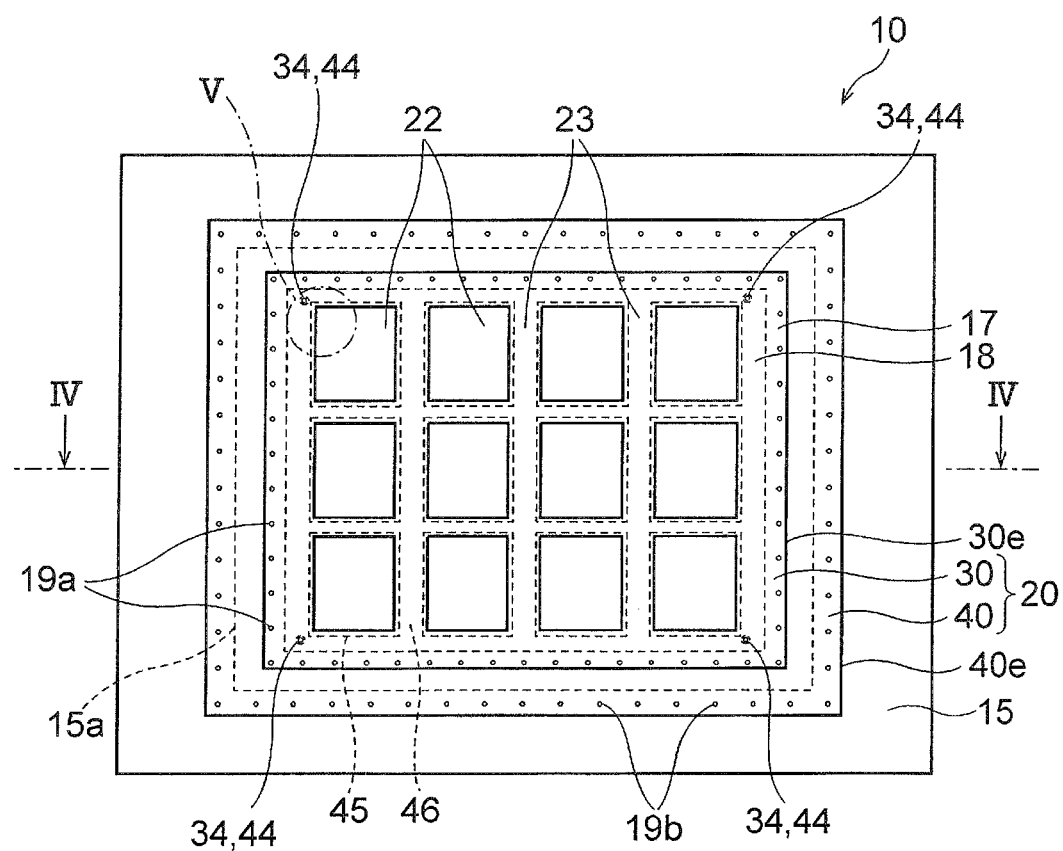
FIG. 3 is a plan view schematically depicting an example of a vapor deposition mask device having a vapor deposition mask according to a first embodiment.

First, the mask main body 30 will be described in detail. The mask main body 30 is produced by a plating treatment. As illustrated in FIG. 3, the mask main body 30 may be substantially rectangular in shape in plan view. The mask main body 30 may include a frame-shaped ear section 17 constituting an outer edge 30e of the mask main body 30, and an intermediate section 18 surrounded by the ear section 17. Of these sections, the ear section 17 is a section mounted to the support 40 at the time of the vapor deposition step using the vapor deposition mask 20. It is to be noted that the ear section 17 is not a region through which the vapor deposition material intended to be vapor-deposited onto the organic EL substrate 92 passes.

Figure 4:
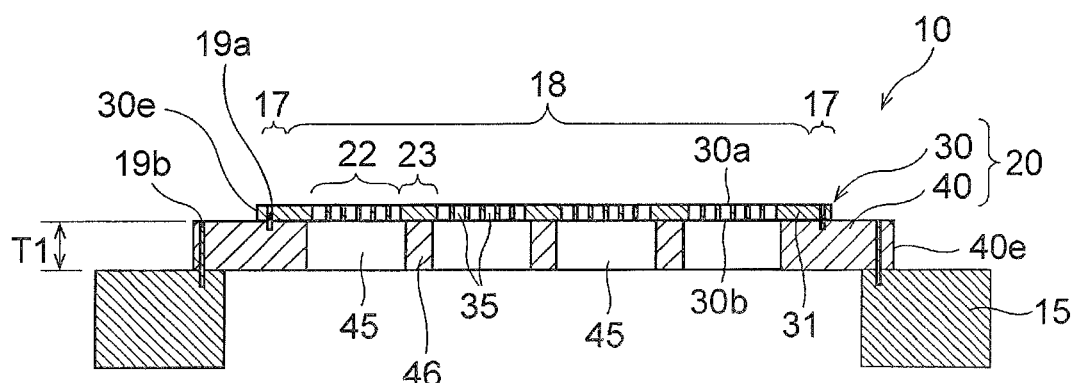
FIG. 4 is a sectional view (a sectional view taken along line IV-IV of FIG. 3) depicting the vapor deposition mask device according to the first embodiment.
Figure 5:
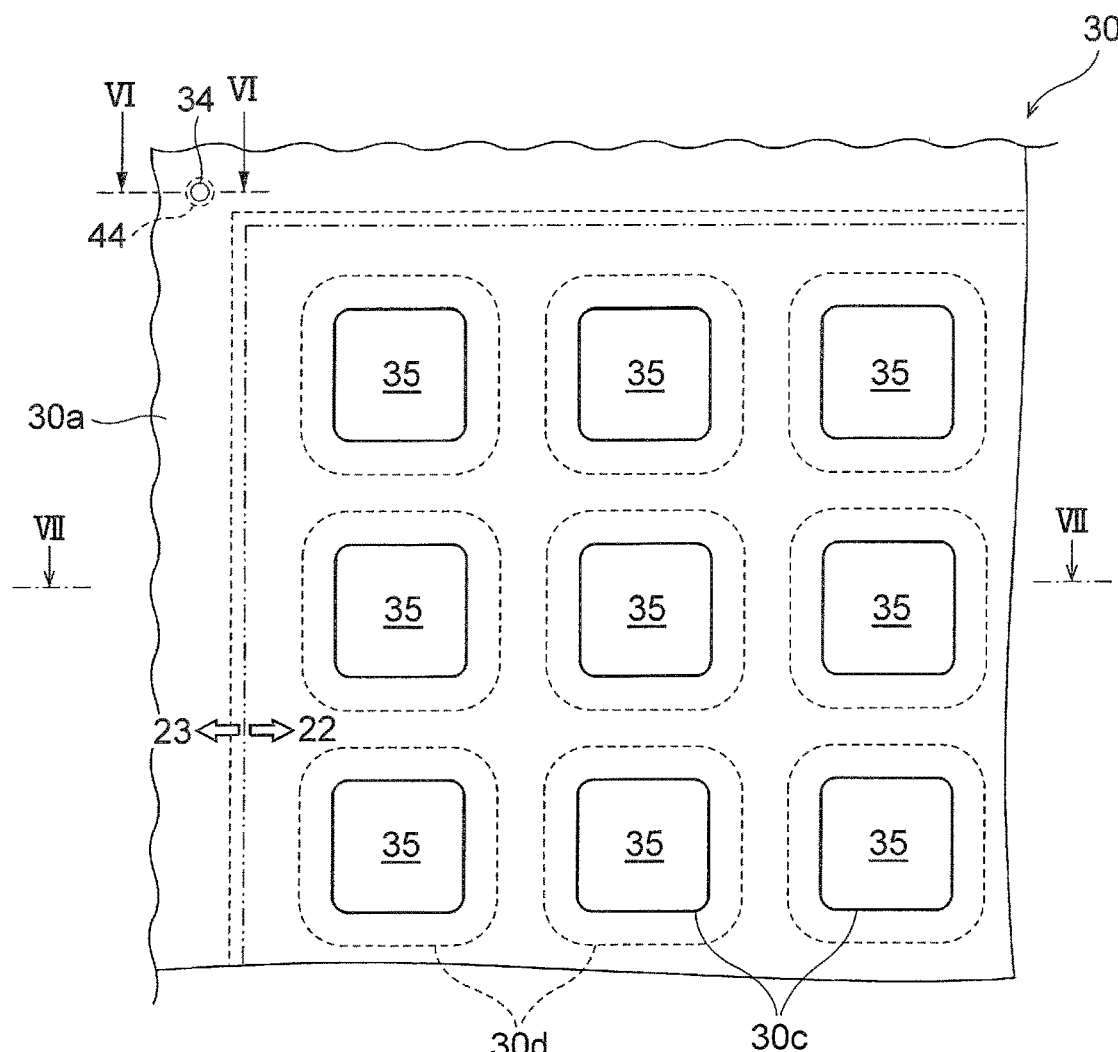
FIG. 5 is a partial enlarged view (an enlarged view of part V of FIG. 3) depicting a mask main body of the vapor deposition mask device according to the first embodiment.

As illustrated in FIGS. 3 to 5, the intermediate section 18 of the vapor deposition mask 20 may include effective regions 22 in which the first through-holes 35 (see FIGS. 4 and 5) are formed in a regular arrangement, and peripheral regions 23 surrounding the effective regions 22. The peripheral regions 23 are regions for supporting the effective regions 22, but are not regions through which the vapor deposition material 98 intended to be vapor-deposited on the organic EL substrate 92 passes. On the other hand, in the vapor deposition mask 20 to be used for vapor deposition of an organic luminescent material, the effective regions 22 of the mask main body 30 are those region in the vapor deposition mask 20 which face a zone to be a display region of the organic EL substrate 92 where the organic luminescent material is vapor-deposited to form the pixels. It is to be noted, however, that through-holes or recesses may be formed in the peripheral regions 23, for various purposes. In the example depicted in FIG. 3, each effective region 22 has an outline which is substantially tetragonal in shape in plan view, more accurately substantially rectangular in shape in plan view. It is to be noted that, though not illustrated, each effective region 22 may have any of variously shaped outlines according to the shape of the display region of the organic EL substrate 92. For example, each effective region may have a circular outline.

As depicted in FIG. 3, the plurality of effective regions 22 of the vapor deposition mask 20 may be arranged at predetermined intervals along two directions orthogonal to each other. In the example illustrated, one effective region 22 corresponds to one organic EL display device. In other words, according to the vapor deposition mask device 10 (the mask main body 30) depicted in FIGS. 3 and 4, multiple-surface vapor deposition is possible. In addition, as illustrated in FIG. 5, the plurality of first through-holes 35 formed in each effective region 22 may be arranged at predetermined pitches along two directions orthogonal to each other, in the effective region 22.

Figure 6:
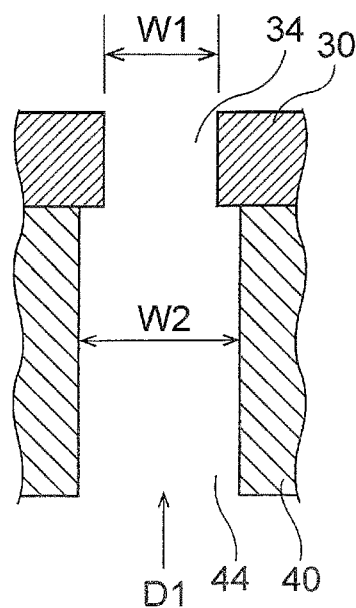
FIG. 6 is a partial sectional view (a sectional view taken along line VI-VI of FIG. 5) depicting the vapor deposition mask device according to the first embodiment.

As illustrated in FIGS. 5 and 6, the mask main body 30 of the vapor deposition mask 20 may have a first alignment mark 34, whereas the support 40 may have a second alignment mark 44. As will be described later, the first alignment mark 34 and the second alignment mark 44 are provided for accurately positioning the mask main body 30 and the support 40 of a second intermediate 57b. When the mask main body 30 and the support 40 are accurately positioned, the centers of the first alignment mark 34 and the second alignment mark 44 coincide with each other. Therefore, the first alignment mark 34 and the second alignment mark 44 may be provided at such positions as to overlap with each other in plan view. The first alignment mark 34 and the second alignment mark 44 may be different from each other in size; specifically, the second alignment mark 44 may be larger than the first alignment mark 34.

In this case, the first alignment mark 34 is a through-hole penetrating the mask main body 30 in its thickness direction, whereas the second alignment mark 44 is a through-hole penetrating the support 40 in its thickness direction. For this reason, when viewed from the support 40 side (in the direction of arrow D1 in FIG. 6), the first alignment mark 34 which is a through-hole may be included in the inside of the second alignment mark 44 which is a through-hole. Therefore, when the mask main body 30 and the support 40 are positioned accurately, an outer edge of the first alignment mark 34 may entirely be located inside the second alignment mark 44.

The shapes of the first alignment mark 34 and the second alignment mark 44 may each be a circle in plan view. In the case where the first alignment mark 34 and the second alignment mark 44 are circular in shape in plan view, the first alignment mark 34 and the second alignment mark 44 which are through-holes can be formed easily. In addition, the first alignment mark 34 and the second alignment mark 44 can be formed with high accuracy. The diameter (width) W2 of the second alignment mark 44 may be not less than 0.15 mm but not more than 2.5 mm, and the diameter (width) W1 of the first alignment mark 34 may be not less than 2% but not more than 98% of the diameter (width) W2 of the second alignment mark 44. In this case, the value of one half the difference between W2 and W1 ((W2-W1)/2) may coincide with an allowable maximum deviation between the first alignment mark 34 and the second alignment mark 44. By this, the first alignment mark 34 and the second alignment mark 44 can easily be aligned with each other. In this case, the allowable maximum deviation (the value of one half the difference between W2 and W1) is preferably equal to or less than 50 μm. The plan-view shapes of the first alignment mark 34 and the second alignment mark 44 are not limited to the circular shapes, and may be elliptic shapes, polygonal shapes, cross shapes, or the like. In this case, the plan-view shapes of the first alignment mark 34 and the second alignment mark 44 are similar to each other, but this is not limitative, and the plan-view shapes may be non-similar shapes (for example, a circular shape and a polygonal shape).

As illustrated in FIG. 3, the first alignment mark 34 and the second alignment mark 44 may be formed in a region other than the effective region 22, of the intermediate section 18 of the vapor deposition mask 20. Specifically, the first alignment mark 34 and the second alignment mark 44 may each be disposed in the number of a total of four, in the four corners of the intermediate section 18. However, the disposing positions and the number of the first alignment marks 34 and the second alignment marks 44 are not limited to these, insofar as they are provided in the number of one or more at a position or positions where the mask main body 30 and the support 40 overlap with each other. It is to be noted that, in order to accurately adhere the mask main body 30 and the support 40 to each other, the first alignment mark 34 and the second alignment mark 44 are preferably disposed at a position close to the effective region 22. Specifically, the first alignment mark 34 and the second alignment mark 44 are preferably provided at a position within a distance of 5 mm from the effective region 22.

Figure 7:
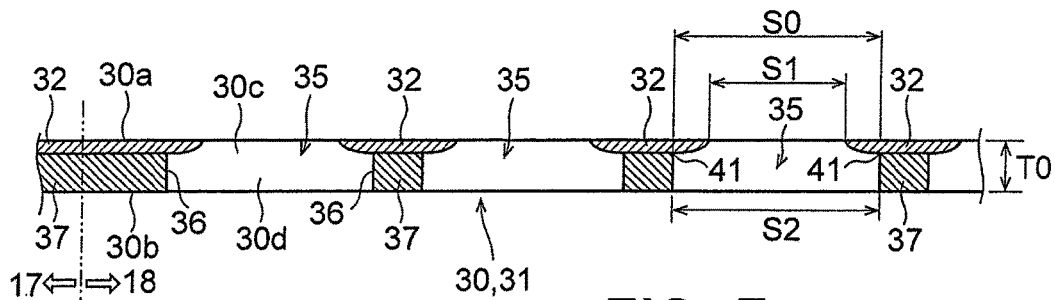
FIG. 7 is a sectional view (a sectional view taken along line VII-VII of FIG. 5) depicting the mask main body according to the first embodiment.
Figure 8:
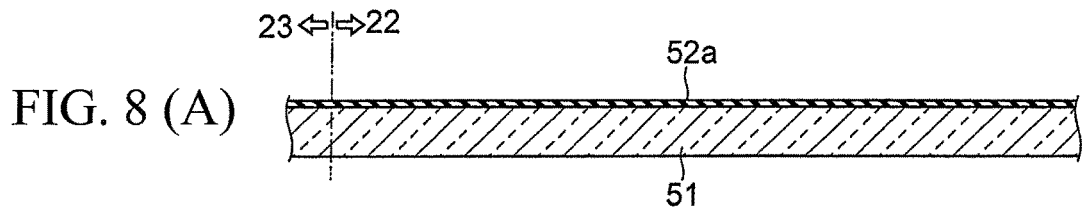
FIGS. 8(A) to 8(D) are diagrams depicting a method of manufacturing a patterned substrate used for manufacturing a mask main body by a plating treatment.
Figure 8:
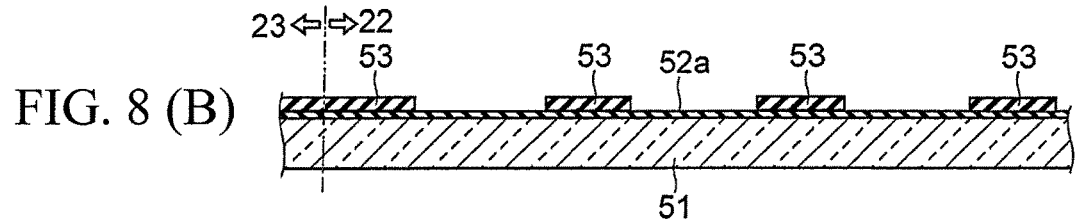
Figure 8:
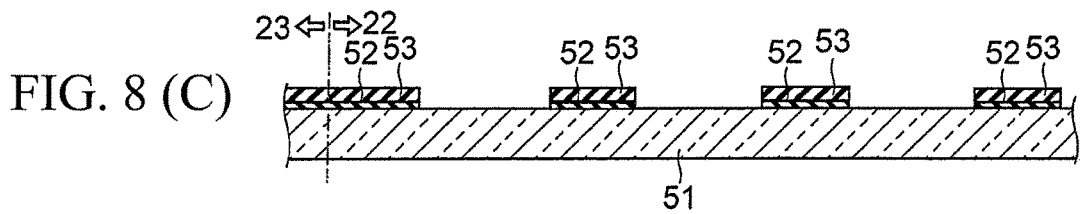
Figure 8:
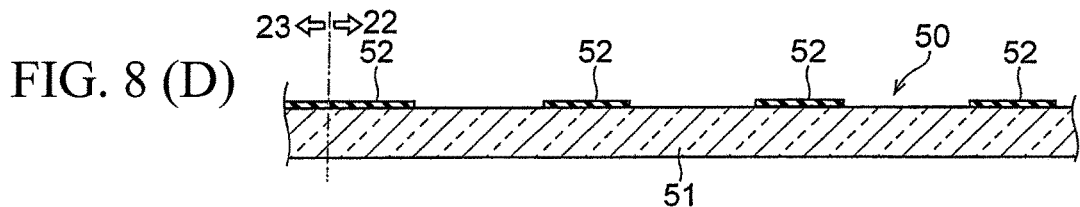

Next, the plating layer 31 of the mask main body 30 will be described referring to FIG. 7. As depicted in FIG. 7, the plating layer 31 of the mask main body 30 may include a first metallic layer 32 provided with first openings 30c in a predetermined pattern, and a second metallic layer 37 provided with second openings 30d communicating with the first openings 30c. In the example illustrated in FIG. 7, the first metallic layer 32 constitutes the first surface 30a of the mask main body 30, and the second metallic layer 37 constitutes the second surface 30b of the mask main body 30.

In the present embodiment, by the communication of the first openings 30c and the second openings 30d with each other, the first through-holes 35 penetrating the mask main body 30 may be configured. In this case, the opening size and the opening shape of the through-holes 35 on the first surface 30a side of the mask main body 30 may be defined by the first openings 30c in the first metallic layer 32. On the other hand, the opening size and the opening shape of the first through-holes 35 on the second surface 30b side of the mask main body 30 may be defined by the second openings 30d in the second metallic layer 37. In other words, both the shape defined by the first openings 30c in the first metallic layer 32 and the shape defined by the second openings 30d in the second metallic layer 37 may be imparted to the first through-holes 35.

As depicted in FIG. 5, the first through-holes 35 may be substantially polygonal in shape in plan view. An example in which the first through-holes 35 are substantially tetragonal in shape, more specifically substantially square in shape, is illustrated here. In addition, though not illustrated, the first through-holes 35 may have other substantially polygonal shapes, such as a substantially hexagonal shape or a substantially octagonal shape. It is to be noted that the term "substantially polygonal shape" is a concept including shapes in which corner parts of polygons are rounded. Moreover, though not illustrated, the first through-holes 35 may be circular in shape. The opening size S1 of the aforementioned first through-holes 35 is suitably set, taking into account the pixel density of the organic EL display device and the like. For example, in the case of manufacturing an organic EL display device with a pixel density of equal to or more than 400 ppi, the opening size S0 of the first through-holes 35 may be set within the range of not less than 15 μm and not more than 60 μm.

In FIG. 7, reference symbol 41 denotes a connection section where the first metallic layer 32 and the second metallic layer 37 are connected to each other. In addition, reference symbol S0 denotes the size of the first through-hole 35 at the connection section 41 between the first metallic layer 32 and the second metallic layer 37. It is to be noted that while an example in which the first metallic layer 32 and the second metallic layer 37 are in contact with each other is illustrated in FIG. 7, this is not limitative, and other layer may be interposed between the first metallic layer 32 and the second metallic layer 37. For example, a catalyst layer for accelerating precipitation of the second metallic layer 37 on the first metallic layer 32 may be provided between the first metallic layer 32 and the second metallic layer 37.

As illustrated in FIG. 7, the opening size S2 of the first through-holes 35 (second openings 30d) in the second surface 30b may be larger than the opening size S1 of the first through-holes 35 (first openings 30c) in the first surface 30a. The aforementioned opening sizes S0, S1 and S2 may suitably be set taking into account the pixel density of the organic EL display device and the like. For example, in the case of manufacturing an organic EL display device with a pixel density of equal to or more than 400 ppi, the opening size S0 of the first through-holes 35 in the connection section 41 may be set within the range of not less than 15 μm and not more than 60 μm. The opening size S1 of the first openings 30c in the first surface 30a may be set within the range of not less than 10 μm and not more than 50 μm, and the opening size S2 of the second openings 30d in the second surface 30b may be set within the range of not less than 15 μm and not more than 80 μm.

In addition, the thickness T0 of the aforementioned mask main body 30 may be, for example, equal to or more than 2 μm, may be equal to or more than 5 μm, may be equal to or more than 10 μm, or may be equal to or more than 15 μm. Moreover, the thickness T0 of the mask main body 30 may be, for example, equal to or less than 20 μm, may be equal to or less than 30 μm, may be equal to or less than 40 μm, or may be equal to or less than 50 μm. The range of the thickness T0 of the mask main body 30 may be defined by a first group consisting of 2 μm, 5 μm, 10 μm, and 15 μm and/or a second group consisting of 20 μm, 30 μm, 40 μm, and 50 μm. The range of the thickness T0 of the mask main body 30 may be defined by any one of the values included in the first group and any one of the values included in the second group. The range of the thickness T0 of the mask main body 30 may be defined by a combination of any two of the values included in the first group. The range of the thickness T0 of the mask main body 30 may be defined by a combination of any two of the values included in the second group. For example, the range of the thickness T0 of the mask main body 30 may be not less than 2 μm and not more than 50 μm, may be not less than 2 μm and not more than 40 μm, may be not less than 2 μm and not more than 30 μm, may be not less than 2 μm and not more than 20 μm, may be not less than 2 μm and not more than 15 μm, may be not less than 2 μm and not more than 10 μm, may be not less than 2 μm and not more than 5 μm, may be not less than 5 μm and not more than 50 μm, may be not less than 5 μm and not more than 40 μm, may be not less than 5 μm and not more than 30 μm, may be not less than 5 μm and not more than 20 μm, may be not less than 5 μm and not more than 15 μm, may be not less than 5 μm and not more than 10 μm, may be not less than 10 μm and not more than 50 μm, may be not less than 10 µm and not more than 40 µm, may be not less than 10 µm and not more than 30 µm, may be not less than 10 µm and not more than 20 µm, may be not less than 10 µm and not more than 15 µm, may be not less than 15 µm and not more than 50 µm, may be not less than 15 µm and not more than 40 µm, may be not less than 15 µm and not more than 30 µm, not less than 15 µm and not more than 20 µm, may be not less than 20 µm and not more than 50 µm, may be not less than 20 µm and not more than 40 µm, may be not less than 20 µm and not more than 30 µm, may be not less than 30 µm and not more than 50 µm, may be not less than 30 µm and not more than 40 µm, or may be not less than 40 µm and not more than 50 µm.

Next, the support 40 will be described in detail. As depicted in FIG. 3, the support 40 may be substantially rectangular in shape in plan view. The support 40 may be larger than the mask main body 30 in size in plane directions, and, in plan view, an outline defining the support 40 may surround an outline defining the mask main body 30. The support 40 may be mounted to the mask main body 30 in such a manner that each side of the support 40 corresponds to each side of the mask main body 30.

In addition, as mentioned above, the support 40 may be formed with the plurality of second through-holes 45, and the second through-holes 45 may be larger than the effective regions 22 of the mask main body 30 in plan view. Moreover, one second through-hole 45 of the support 40 may correspond to one effective region 22 of the mask main body 30.

As illustrated in FIG. 3, the outline of the second through-hole 45 may be, for example, substantially tetragonal in plan view, more accurately substantially rectangular in plan view. It is to be noted that, though not illustrated, the second through-holes 45 may each have any of variously shaped outlines according to the shape of the display region of the vapor deposition substrate (organic EL substrate) 92. For example, the second through-holes 45 may each have a circular outline. While an example in which the second through-holes 45 have the same plan-view shape is depicted in FIG. 3, this is not limitative, and the second through-holes 45 may have different opening shapes. In other words, the support 40 may have a plurality of second through-holes 45 differing in plan-view shape.

A support region 46 may be provided in the periphery of the second through-hole 45, and the support region 46 may support the peripheral region 23 of the mask main body 30. As a result, the support 40 can support the mask main body 30 such as to surround the effective regions 22 of the mask main body 30, and, therefore, generation of wrinkles or deformation in the mask main body 30 can effectively be prevented. It is to be noted that the support regions 46 are not regions through which the vapor deposition material 98 intended to be vapor-deposited on the organic EL substrate 92 passes.

In the present disclosure, the thickness T1 of the support 40 may be, for example, equal to or more than 0.2 mm, may be equal to or more than 0.4 mm, may be equal to or more than 0.6 mm, or may be equal to or more than 0.8 mm. Moreover, the thickness T1 of the support 40 may be, for example, equal to or less than 1.0 mm, may be equal to or less than 1.2 mm, may be equal to or less than 1.5 mm, or may be equal to or less than 2.0 mm. The range of the thickness T1 of the support 40 may be defined by a first group consisting of 0.2 mm, 0.4 mm, 0.6 mm, and 0.8 mm and/or a second group consisting of 1.0 mm, 1.2 mm, 1.5 mm, and 2.0 mm. The range of the thickness T1 of the support 40 may be defined by a combination of anyone of the values included in the first group and any one of the values included in the second group. The range of the thickness T1 of the support 40 may be defined by a combination of any two of the values included in the first group. The range of the thickness T1 of the support 40 may be defined by a combination of any two of the values included in the second group. For example, the range of the thickness T1 of the support 40 may be not less than 0.2 mm and not more than 2.0 mm, may be not less than 0.2 mm and not more than 1.5 mm, may be not less than 0.2 mm and not more than 1.2 mm, may be not less than 0.2 mm and not more than 1.0 mm, may be not less than 0.2 mm and not more than 0.8 mm, may be not less than 0.2 mm and not more than 0.6 mm, may be not less than 0.2 mm and not more than 0.4 mm, may be not less than 0.4 mm and not more than 2.0 mm, may be not less than 0.4 mm and not more than 1.5 mm, may be not less than 0.4 mm and not more than 1.2 mm, may be not less than 0.4 mm and not more than 1.0 mm, may be not less than 0.4 mm and not more than 0.8 mm, may be not less than 0.6 mm and not more than 2.0 mm, may be not less than 0.6 mm and not more than 1.5 mm, may be not less than 0.6 mm and not more than 1.2 mm, may be not less than 0.6 mm and not more than 1.0 mm, may be not less than 0.8 mm and not more than 2.0 mm, may be not less than 0.8 mm and not more than 1.5 mm, may be not less than 0.8 mm and not more than 1.2 mm, may be not less than 1.0 mm and not more than 1.0 rum and not more than 2.0 mm, may be not less than 1.0 mm and not more than 1.5 mm, may be not less than 1.0 mm and not more than 1.2 mm, may be not less than 1.2 mm and not more than 2.0 mm, may be not less than 1.2 mm and not more than 1.5 mm, or may be not less than 1.5 mm and not more than 2.0 mm. With the thickness T1 of the support 40 set to be equal to or more than 0.2 mm, rigidity of the vapor deposition mask 20 can be enhanced. This makes it possible to prevent generation of wrinkles or deformation in the mask main body 30. In addition, with the thickness T1 of the support 40 set to be equal to or less than 2.0 mm, it is possible to prevent occurrence of such a trouble that the base material 51 cannot be exfoliated, at the time of exfoliating the base material 51 from the mask main body 30 joined to the support 40 as will be described later.

A nickel-containing iron alloy can be used as a main material constituting the support 40 mentioned above. For example, such iron alloys as an invar material containing not less than 34 wt % but not more than 38 wt % of nickel and a super invar material further containing cobalt in addition to nickel can be used. Moreover, these are not limitative, and iron alloys other than the abovementioned nickel-containing iron alloys, such as a chromium-containing iron alloy, may also be used. As the chromium-containing iron alloy, there can be used, for example, iron alloys called stainless steels. Furthermore, Other alloys other than the iron alloys, such as nickel and nickel-cobalt alloys, may also be used.

Next, the frame 15 will be described in detail. As depicted in FIG. 3, the frame 15 may be formed in a substantially rectangular frame shape in plan view, and the frame 15 may be provided with an opening 15a overlapping with the second through-holes 45 of the support 40 in plan view. In the present disclosure, an outline defining the opening 15a in plan view may surround all the outlines defining the second through-holes 45. At the time of vapor deposition, the vapor deposition material 98 evaporated from the crucible 94 passes through the opening 15a of the frame 15 to reach the vapor deposition mask 20.

Moreover, the frame 15 may be larger than the support 40 in size in plane directions, and an outline defining the frame 15 may surround an outline defining the support 40 in plan view. The frame 15 may be mounted to the support 40 in such a manner that each side of the frame 15 corresponds to each side of the support 40.

Here, as illustrated in FIGS. 3 and 4, the mask main body 30 and the support 40 mentioned above may be joined to each other by a plurality of first joint sections 19a. The support 40 and the frame 15 mentioned above may be joined to each other by a plurality of second joint sections 19b. The first joint sections 19a may be arranged along an outer edge 30e of the mask main body 30, whereas the second joint sections 19b may be arranged along an outer edge 40e of the support 40. As mentioned above, the mask main body 30 and the support 40 may have substantially rectangular outlines in plan view. Therefore, the joint sections 19a and 19b may also be arranged in a substantially rectangular pattern along the outer edges 30e and 40e. In the example illustrated in FIG. 3, the joint sections 19a and 19b are arranged rectilinearly at certain distances from the outer edges 30e and 40e. In other words, the joint sections 19a and 19b are arranged in directions parallel to the directions in which the outer edges 30e and 40e extend.

In the example illustrated, the joint sections 19a and 19b are arranged at regular intervals along the directions in which the outer edges 30e and 40e extend. In the present embodiment, the mask main body 30 and the support 40 as well as the support 40 and the frame 15 are joined to each other by spot welding. It is to be noted that this is not limitative; the mask main body 30 and the support 40 as well as the mask main body 30 and the frame 15 may be joined to each other by other fixing means such as an adhesive.

Next, a method of manufacturing the vapor deposition mask device 10 will be described. First, a method of manufacturing the vapor deposition mask 20 of the vapor deposition mask device 10 will be described.

First, the mask main body 30 having the plating layer 31 which is joined to the base material 51 and is formed with the plurality of first through-holes 35 may be prepared. In this instance, first, the base material 51 may be prepared. The material constituting the base material 51 and the thickness of the base material 51 are not particularly limited, insofar as the base material 51 has an insulating property and a suitable strength. In the case where the mask main body 30 and the support 40 or the support 40 and the frame 15 are welded and fixed by irradiation with laser light through the base material 51, as will be described later, a glass material having a high light transmittance may preferably be used as a material constituting the base material 51. In the case where the mask main body 30 and the support 40 or the support 40 and the frame 15 are fixed to each other by use of an adhesive, a glass, a synthetic resin, a metal, or the like may be used as a material constituting the base material 51. In this case, the base material 51 is not necessarily required to have a light-transmitting property. Here, an example in which a light-transmitting glass material is used as the base material 51 will be described.

Next, as depicted in FIG. 8(A), a conductive layer 52a including a conductive material may be formed on the base material 51. The conductive layer 52a is a layer which becomes a conductive pattern 52 by being patterned. A conductive material such as a metallic material and an oxide conductive material is appropriately used as a material constituting the conductive layer 52a. Examples of the metallic material include chromium and copper. Preferably, a material having a high close contact property relative to a first resist pattern 53 to be described later is used as the material constituting the conductive layer 52a. For example, in the case where the first resist pattern 53 is produced by patterning what is generally called a dry film such as a resist film including an acrylic photo-curing resin, it is preferable to use copper as the material constituting the conductive layer 52a.

The conductive layer 52a may be formed, for example, by sputtering, electroless plating, or the like. When it is intended to form the conductive layer 52a in a thick form, it takes a long period of time to form the conductive layer 52a. On the other hand, if the thickness of the conductive layer 52a is too small, resistance is high, and it is difficult to form the first metallic layer 32 by an electroplating treatment. Therefore, for example, the thickness of the conductive layer 52a is preferably within the range of not less than 50 nm and not more than 500 nm.

Next, as illustrated in FIG. 8(B), the first resist pattern 53 having a predetermined pattern may be formed on the conductive layer 52a. As a method for forming the first resist pattern 53, a photolithography method or the like may be adopted, as in the case of a second resist pattern 55 to be described later. As a method for irradiating a material for the first resist pattern 53 with light in a predetermined pattern, there may be adopted a method of using an exposure mask which transmits exposure light in a predetermined pattern, a method of proportionately scanning exposure light in a predetermined pattern relative to a material for the first resist pattern 53, or the like. Thereafter, as illustrated in FIG. 8(C), those parts of the conductive layer 52a which are not covered with the first resist pattern 53 are removed by etching. Next, as depicted in FIG. 8(D), the first resist pattern 53 is removed. As a result, a patterned substrate 50 formed with a conductive pattern 52 having a pattern corresponding to the first metallic layer 32 can be obtained.

Next, a plating layer 31 may be precipitated on the conductive pattern 52 by using the base material 51 (patterned substrate 50) preliminarily formed with the predetermined conductive pattern 52.

First, a first film forming step of producing the above-mentioned first metallic layer 32 by using the patterned substrate 50 will be described. Here, the first metallic layer 32 provided with the first opening 30c in a predetermined pattern is formed over the base material 51 which has an insulating property. Specifically, a first plating treatment step in which a first plating liquid is supplied onto the base material 51 formed with the conductive pattern 52, to precipitate the first metallic layer 32 on the conductive pattern 52 is conducted. For example, the base material 51 formed with the conductive pattern 52 is immersed in a plating tank filled with the first plating liquid. As a result, as depicted in FIG. 9(A), the first metallic layer 32 provided with the first opening 30c in the predetermined pattern can be obtained over the base material 51. It is to be noted that the thickness of the first metallic layer 32 is, for example, equal to or less than 5 μm. In addition, forming the first metallic layer 32 over the base material 51 is not limited to forming the first metallic layer 32 directly on the base material 51, and includes forming the first metallic layer 32 over the base material 51 with other layers such as the conductive pattern 52 interposed therebetween.

It is to be noted that due to characteristics of a plating treatment, as illustrated in FIG. 9(A), the first metallic layer 32 may be formed not only over those parts of the base material 51 which overlap with the conductive pattern 52 as viewed along the normal direction to the base material 51 but also over those parts of the base material 51 which do not overlap with the conductive pattern 52. This is because the first metallic layer 32 is further precipitated on the surface of the first metallic layer 32 precipitated on the parts overlapping with end portions 54 of the conductive pattern 52. As a result, as depicted in FIG. 9(A), end portions 33 of the first openings 30c may be located at the parts not overlapping with the conductive pattern 52 as viewed along the normal direction to the base material 51.

A specific method for the first plating treatment step is not particularly limited, insofar as the first metallic layer 32 can be precipitated on the conductive pattern 52. For example, the first plating treatment step may be carried out as what is generally called an electroplating treatment step in which a current is passed through the conductive pattern 52 to precipitate the first metallic layer 32 on the conductive pattern 52. Alternatively, the first plating treatment step may be an electroless plating treatment step. It is to be noted that in the case where the first plating treatment step is the electroless plating treatment step, a suitable catalyst layer may be provided on the conductive pattern 52. Alternatively, the conductive pattern 52 may be configured such as to function as a catalyst layer. Also in the case where the electroplating treatment step is performed, a catalyst layer may be provided on the conductive pattern 52.

Constituents of the first plating liquid to be used are appropriately determined according to the characteristics required of the first metallic layer 32. For example, a mixed solution of a solution containing a nickel compound and a solution containing an iron compound may be used as the first plating liquid. For example, a mixed solution of a solution containing nickel sulfamate or nickel bromide and a solution containing ferrous sulfamate may be used. Various additives may be contained in the plating liquid. Examples of the additives which can be used include a pH buffer such as boric acid, a primary brightening agent such as sodium saccharate, a secondary brightening agent such as butynediol, propargyl alcohol, coumarin, formalin, and thiourea, and an antioxidant.

Next, a second film forming step in which the second metallic layer 37 provided with second openings 30d communicating with the first openings 30c is formed on the first metallic layer 32 may be conducted. In this instance, first, on the base material 51 and the first metallic layer 32, a second resist pattern 55 is formed, with predetermined gaps 56 between parts of the second resist pattern 55. FIG. 9(B) is a sectional view depicting the second resist pattern 55 formed on the base material 51. As illustrated in FIG. 9(B), the resist forming step is conducted in such a manner that the first openings 30c of the first metallic layer 32 are covered with the second resist pattern 55, and the gaps 56 of the second resist pattern 55 are located on the first metallic layer 32.

An example of the resist forming step will be described below. First, a dry film is adhered onto the base material 51 and the first metallic layer 32, to form a negative-type resist film. Examples of the dry film include acrylic photocuring resins such as RY3310 produced by Hitachi Chemical Company, Ltd. A material for the second resist pattern 55 may be applied to the base material 51, followed by baking, if required, to form a resist film. Next, an exposure mask such as to prevent light from being transmitted through those regions of the resist film which are to be the gaps 56 is prepared, and the exposure mask is disposed on the resist film. Thereafter, the exposure mask is put into sufficient close contact with the resist mask by vacuum. It is to be noted that, as the resist film, a positive-type one may also be used. In this case, an exposure mask such as to permit light to be transmitted through those parts of the resist film which are to be removed is used as the exposure mask.

Thereafter, the resist film may be exposed to light through the exposure mask. The resist film thus exposed may be developed to form the resist film with an image. It is to be noted that, for bringing the second resist pattern 55 into firmer close contact with the base material 51 and the first metallic layer 32, a heat treatment step of heating the second resist pattern 55 may be carried out after the developing step.

Next, the second metallic layer 37 may be formed on the first metallic layer 32. In this instance, the second metallic layer 37 provided with the second openings 30d communicating with the first openings 30c may be formed on the first metallic layer 32. Specifically, a second plating liquid may be supplied to the gaps 56 of the second resist pattern 55, to precipitate the second metallic layer 37 on the first metallic layer 32. For example, the base material 51 formed with the first metallic layer 32 may be immersed in a plating tank filled with the second plating liquid. As a result, as depicted in FIG. 9(C), the second metallic layer 37 can be obtained on the first metallic layer 32. It is to be noted that the thickness of the second metallic layer 37 is set such that the thickness T0 (see FIG. 7) of the plating layer 31 of the vapor deposition mask 20 in the effective regions 22 will be not less than 2 μm but not more than 50 μm.

A specific method for the second plating treatment step is not particularly limited, insofar as the second metallic layer 37 can be precipitated on the first metallic layer 32. For example, the second plating treatment step may be conducted as what is generally called an electroplating treatment step in which a current is passed through the first metallic layer 32 to precipitate the second metallic layer 37 on the first metallic layer 32. Alternatively, the second plating treatment step may be an electroless plating treatment step. It is to be noted that in the case where the second plating treatment step is the electroless plating treatment step, a suitable catalyst layer may be provided on the first metallic layer 32. Also in the case where the electroplating treatment step is performed, a catalyst layer may be provided on the first metallic layer 32.

As the second plating liquid, the same plating liquid as the first plating liquid mentioned above may be used. Alternatively, a plating liquid different from the first plating liquid may be used as the second plating liquid. In the case where the first plating liquid and the second plating liquid are the same with each other in composition, the composition of the metal constituting the first metallic layer 32 and the composition of the metal constituting the second metallic layer 37 are the same.

It is to be noted that, while an example in which the second plating treatment step is continued until an upper surface of the second resist pattern 55 and an upper surface of the second metallic layer 37 coincide with each other has been depicted in FIG. 9(C), this is not limitative. The second plating treatment step may be stopped in a state in which the upper surface of the second metallic layer 37 is located below the upper surface of the second resist pattern 55.

Figure 9:
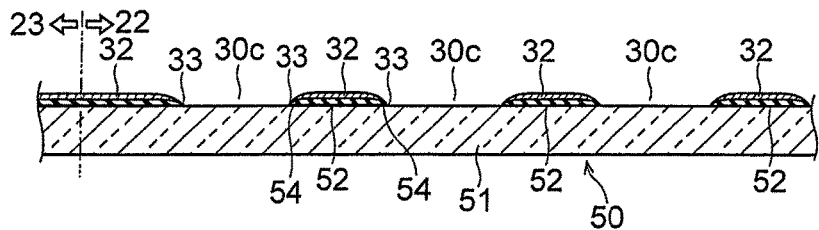
FIGS. 9(A) to 9(D) are diagrams depicting a method of manufacturing the mask main body by a plating treatment.
Figure 9:
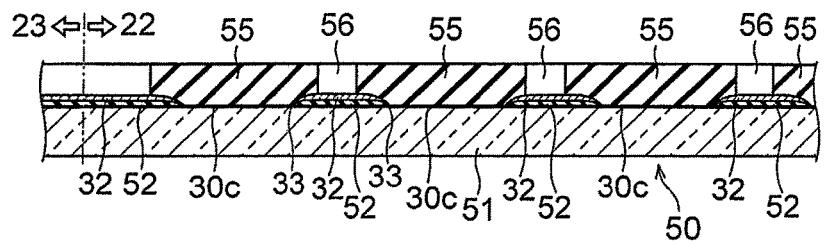
Figure 9:
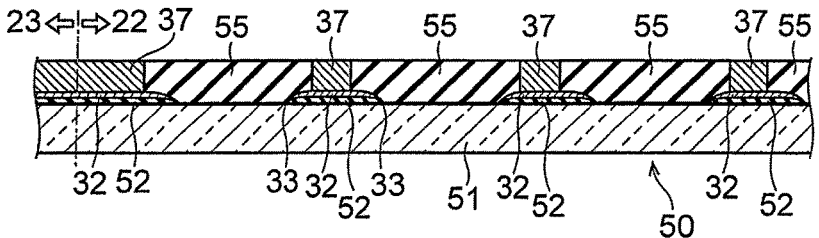
Figure 9:
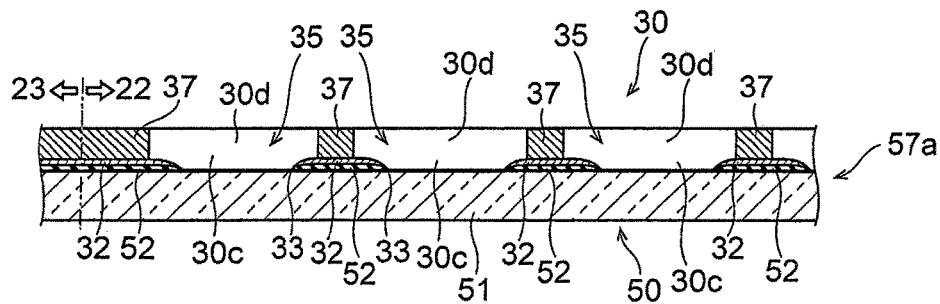
Figure 10:
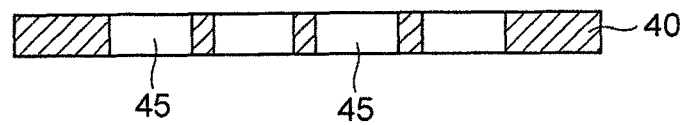
FIGS. 10(A) to 10(D) are diagrams depicting a method of manufacturing a vapor deposition mask.
Figure 10:
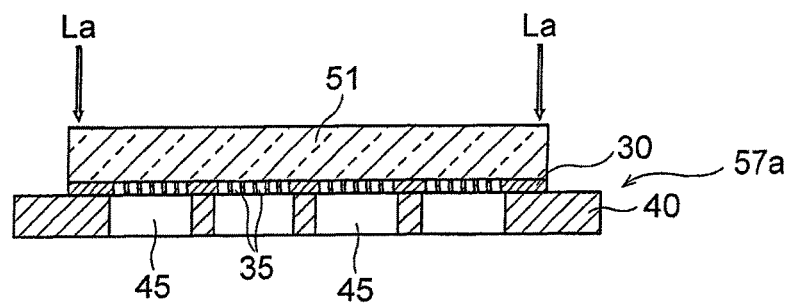
Figure 10:
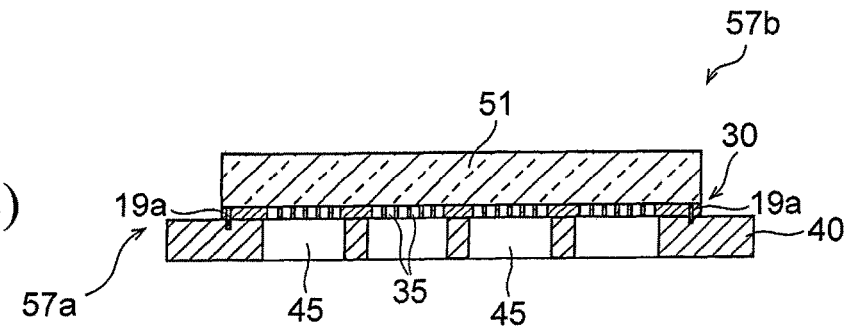
Figure 10:
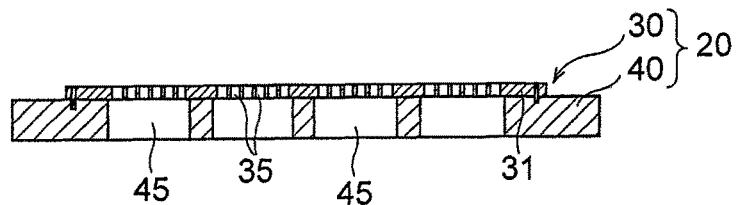

Thereafter, a removal step of removing the second resist pattern 55 may be conducted. The removal step may be carried out by immersing the stacked body of the patterned substrate 50, the first metallic layer 32, the second metallic layer 37, and the second resist pattern 55 in, for example, an alkaline stripping solution. As a result, as depicted in FIG. 9 (D), the second resist pattern 55 can be stripped from the patterned substrate 50, the first metallic layer 32, and the second metallic layer 37. In this way, a first intermediate 57a including the base material 51 and the mask main body 30 joined to the base material 51 is obtained. In addition, in this instance, the second metallic layer 37 provided with the second openings 30*d* in a predetermined pattern can be obtained on the first metallic layer 32. Moreover, with the first openings 30*c* and the second openings 30*d* communicating with each other, the first through-holes 35 penetrating the mask main body 30 are formed. In this way, by precipitating the plating layer 31 on the conductive pattern 52, the plurality of first through-holes 35 are formed. It is to be noted that, though not illustrated in FIG. 9(D), the mask main body 30 is formed with the first alignment mark 34 (see FIGS. 5 and 6) which is a through-hole penetrating the mask body 30 in its thickness direction, similarly to the first through-holes 35.

Furthermore, concurrently with the preparation of the first intermediate 57*a* including the base material 51 and the mask main body 30, the support 40 formed with the second through-holes 45 may be prepared, as depicted in FIG. 10(A). In this instance, first, a metallic plate may be prepared, and the metallic plate may be patterned by a photolithography method including an exposure step and a development step. As a result, the support 40 formed with the second through-holes 45 can be obtained. It is to be noted that, though not illustrated in FIG. 10(A), the support 40 may be formed with the second alignment mark 44 (see FIGS. 5 and 6) which is a through-hole penetrating the support 40 in its thickness direction, similarly to the second through-holes 45.

It is to be noted that in the case of producing the support 40 by etching a thick metallic plate (for example, equal to or more than 300 μm thick), the thickness of a dry film resist used in the etching may be, for example, equal to or more than 5 μm, may be equal to or more than 6 μm, may be equal to or more than 8 μm, or may be equal to or more than 10 μm. The thickness of the dry film resist may be, for example, equal to or less than 12 μm, may be equal to or less than 15 μm, may be equal to or less than 18 μm, or may be equal to or less than 20 μm. The range of the thickness of the dry film resist may be defined by a first group consisting of 5 μm, 6 μm, 8 μm, and 10 μm and/or a second group consisting of 12 μm, 15 μm, 18 μm, and 20 μm. The range of the thickness of the dry film resist may be defined by a combination of any one of the values included in the first group and any one of the values included in the second group. The range of the dry film resist may be defined by a combination of any two of the values included in the first group. The range of the thickness of the dry film resist may be defined by a combination of any two of the values included in the second group. For example, the range of the thickness of the dry film resist may be not less than 5 μm and not more than 20 μm, may be not less than 5 μm and not more than 18 μm, may be not less than 5 μm and not more than 15 μm, may be not less than 5 μm and not more than 12 μm, may be not less than 5 μm and not more than 10 μm, may be not less than 5 μm and not more than 8 μm, may be not less than 5 μm and not more than 6 μm, may be not less than 6 μm and not more than 20 μm, may be not less than 6 μm and not more than 18 μm, may be not less than 6 μm and not more than 15 μm, may be not less than 6 μm and not more than 12 μm, may be not less than 6 μm and not more than 10 μm, may be not less than 6 μm and not more than 8 μm, may be not less than 8 μm and not more than 20 μm, may be not less than 8 μm and not more than 18 μm, may be not less than 8 μm and not more than 15 μm, may be not less than 8 μm and not more than 12 μm, may be not less than 8 μm and not more than 10 μm, may be not less than 10 μm and not more than 20 μm, may be not less than 10 μm and not more than 18 μm, may be not less than 10 μm and not more than 15 μm, may be not less than 10 μm and not more than 12 μm, may be not less than 12 μm and not more than 20 μm, may be not less than 12 μm and not more than 18 μm, may be not less than 12 μm and not more than 15 μm, may be not less than 15 μm and not more than 20 μm, may be not less than 15 μm and not more than 18 μm, or may be not less than 18 μm and not more than 20 μm. With the thickness of the dry film resist set to be equal to or more than 5 μm, generation of chipping of the resist film during etching can be prevented. With the thickness of the dry film resist set to be equal to or less than 20 μm, accuracy of etching can be enhanced.

As a material constituting the support 40, for example, there can be used iron alloys such as an invar material containing not less than 34 wt % but not more than 38 wt % of nickel, and a super invar material further containing cobalt in addition to nickel.

Next, a joining step of joining the mask main body 30 and the support 40 of the first intermediate 57*a* may be performed. In the joining step, the support 40 and the mask main body 30 may be joined to each other such that the second through-holes 45 of the support 40 and the first through-holes 35 of the mask main body 30 overlap with each other in plan view. In this instance, first, as illustrated in FIG. 10(B), the mask main body 30 may be disposed on the support 40 the mask main body 30 and the support 40 are positioned accurately. At this time, the positions of the first alignment mark 34 of the mask main body 30 and the second alignment mark 44 of the support 40 may be aligned with each other, and the centers of the first alignment mark 34 and the second alignment mark 44 may be made to coincide with each other, to thereby adjust the positions of the mask main body 30 and the support 40.

Figure 11:
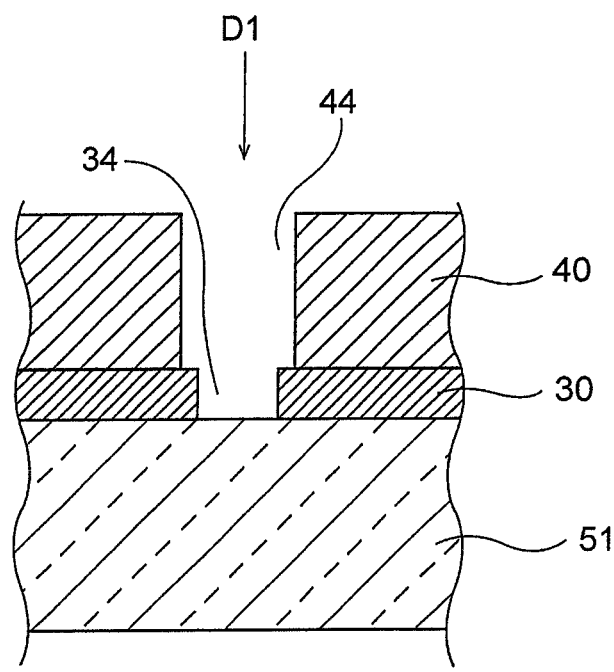
FIG. 11 is a sectional view depicting a first alignment mark and a second alignment mark at the time of positioning a mask main body and a support of a vapor deposition mask.
Figure 12:
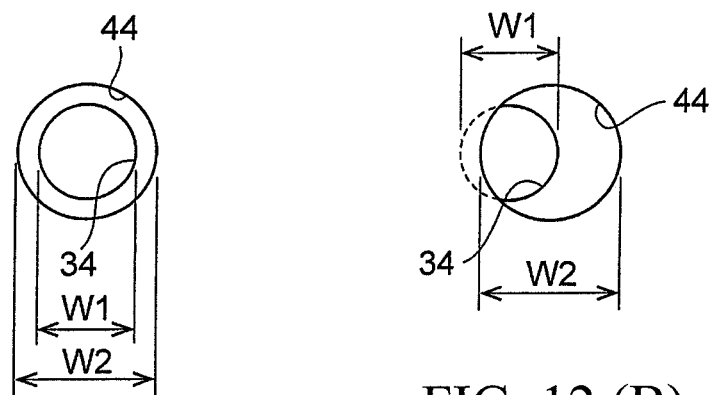
FIGS. 12(A) and 12(B) are plan views depicting the first alignment mark and the second alignment mark at the time of positioning the mask main body and the support of the vapor deposition mask.
Figure 13:
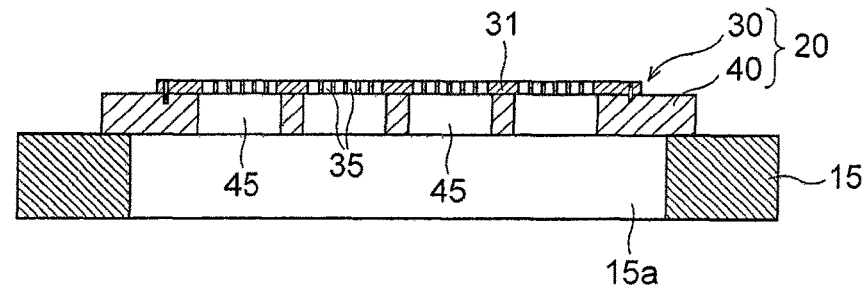
FIGS. 13(A) to 13(C) are diagrams depicting an example of a method of manufacturing a vapor deposition mask device.
Figure 13:
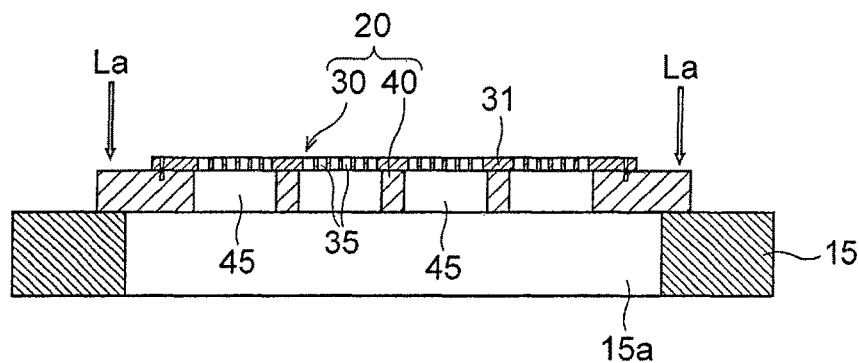
Figure 13:
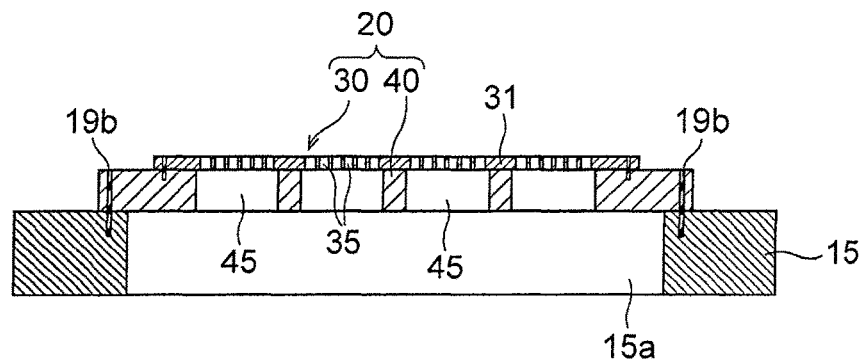

Specifically, the relative positions of the mask main body 30 and the support 40 may be adjusted in such a manner that the first alignment mark 34 is included in the inside of the second alignment mark 44, as viewed from the side of the support 40 which side is opposite the side where the support 40 and the mask main body 30 are to be joined (in the direction of arrow D1 in FIG. 11). For example, let the diameter of the first alignment mark 34 be W1, and let the diameter of the second alignment mark 44 be W2, then it is assumed that (W2-W1)/2 is an allowable alignment error. In this instance, in the case where the first alignment mark 34 of the mask main body 30 is entirely located inside the second alignment mark 44, as illustrated in FIG. 12(A), it is determined that the first alignment mark 34 and the second alignment mark 44 are in a correct positional relation (within the range of the allowable alignment error). On the other hand, in the case where the first alignment mark 34 of the mask main body 30 overlaps with the second alignment mark 44, as depicted in FIG. 12(B), it is determined that the first alignment mark 34 and the second alignment mark 44 are deviated from each other (outside of the range of the allowable alignment error). By performing such alignment for all the first alignment marks 34 and the second alignment marks 44, the mask main body 30 and the support 40 may be disposed in the correct positional relation.

Next, the mask main body 30 of the first intermediate 57*a* may be irradiated with laser light La from the base material 51 side through the base material 51, to melt part of the second metallic layer 37 and part of the support 40 by heat generated by the irradiation with the laser light La, thereby joining the mask main body 30 and the support 40 to each other by welding. As the laser light La, there can be used, for example, YAG laser light generated by a YAG laser device.

As the YAG laser device, there can be used, for example, one in which a crystal obtained by adding Nd (neodymium) to YAG (yttrium aluminum garnet) is provided as an oscillating medium.

As a result, as depicted in FIG. 10(C), the second intermediate 57b which includes the base material 51, the mask main body 30 joined to the base material 51, and the support 40 joined to the mask main body 30 and in which the first joint sections 19a for joining the mask main body 30 and the support 40 are formed is obtained. In the present embodiment, such a second intermediate (intermediate) 57b is also provided. Since the mask main body 30 and the support 40 are joined to each other in the state in which the first alignment mark 34 and the second alignment mark 44 are aligned, as described above, the second through-holes 45 of the support 40 and the first through-holes 35 of the mask main body 30 can accurately be overlapped with each other in plan view. It is to be noted that this is not limitative; the mask main body 30 and the support 40 may be joined to each other by other fixing means such as an adhesive, or the mask main body 30 and the support 40 may be joined to each other by a plating treatment.

Next, an exfoliation step of exfoliating the base material 51 from the mask main body 30 of the second intermediate 57b may be performed. In the exfoliation step, first, the second intermediate 57b may be immersed in an etching liquid that is capable of selectively etching the conductive pattern 52 (see FIG. 9(D)). Next, the base material 51 may be separated from the second intermediate 57b by peeling off. Thereafter, the combined body of the mask main body 30 and the support 40 may be immersed in an etching liquid again, to completely remove by etching the conductive pattern 52 left deposited on the mask main body 30. As a result, as depicted in FIG. 10(D), the vapor deposition mask 20 including the mask main body 30 which has the plating layer 31 formed with the plurality of first through-holes 35 and the support 40 which is joined to the mask main body 30 and which is formed with the plurality of second through-holes 45 overlapping with the first through-holes 35 in plan view can be obtained.

Next, a method of manufacturing the vapor deposition mask device 10 will be described.

First, the vapor deposition mask 20 is produced by, for example, the method depicted in FIGS. 8(A) to 10(D).

Next, the vapor deposition mask 20 may be joined to the frame 15. In this case, the frame 15 and the support 40 may be joined to each other in such a manner that the opening 15a of the frame 15 and the second through-holes 45 of the support 40 overlap with each other in plan view. In this instance, as depicted in FIG. 13(A), the vapor deposition mask 20 may be disposed on the frame 15 in such a manner that the support 40 and the frame 15 come into contact with each other. Next, as illustrated in FIG. 13(B), the support 40 may be irradiated with laser light La, to melt part of the support 40 and part of the frame 15 by heat generated by the irradiation with the laser light La, thereby joining the support 40 and the frame 15 to each other by welding.

As a result, as depicted in FIG. 13(C), the vapor deposition mask device 10 which includes the vapor deposition mask 20 and the frame 15 joined to the support 40 of the vapor deposition mask 20 and provided with the opening 15a overlapping with the second through-holes 45 in plan view and in which the second joint sections 19b for joining the support 40 and the frame 15 to each other are formed is obtained. It is to be noted that this is not limitative; the support 40 and the frame 15 may be joined to each other by other fixing means such as an adhesive.

Figure 14:
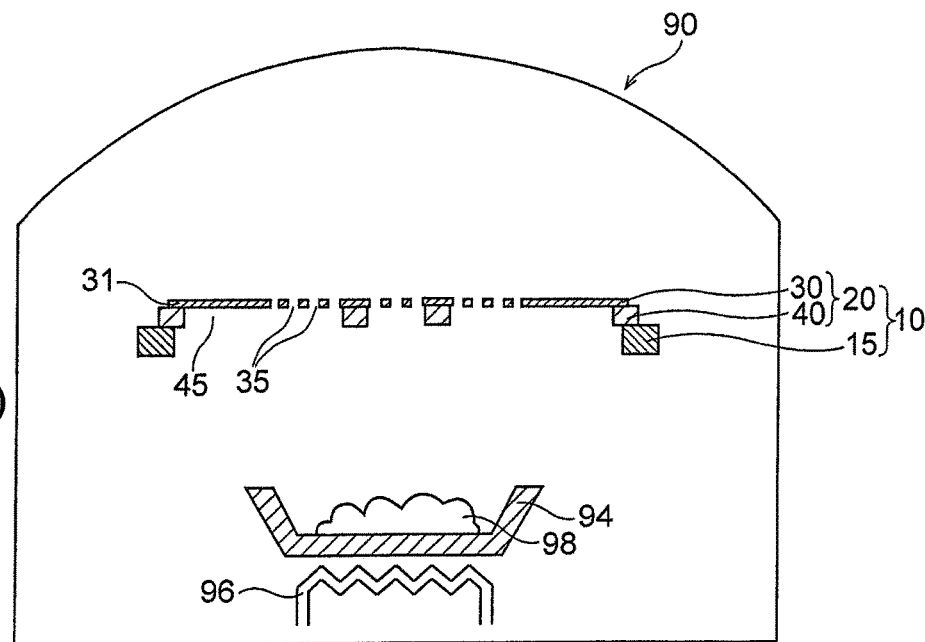
FIGS. 14(A) and 14(B) are diagrams depicting a step of vapor-depositing a vapor deposition material onto an organic EL substrate.
Figure 14:
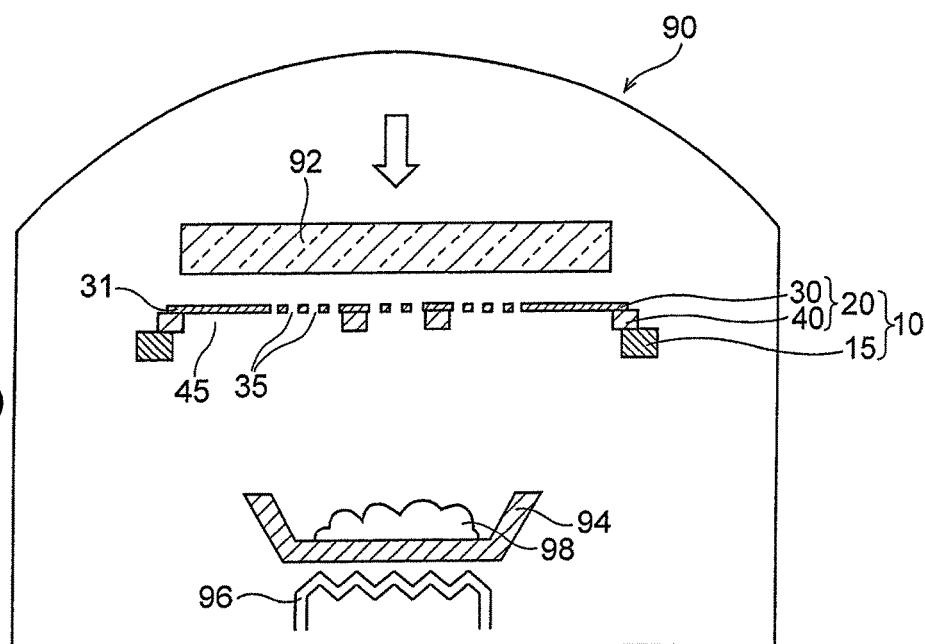
Figure 15:
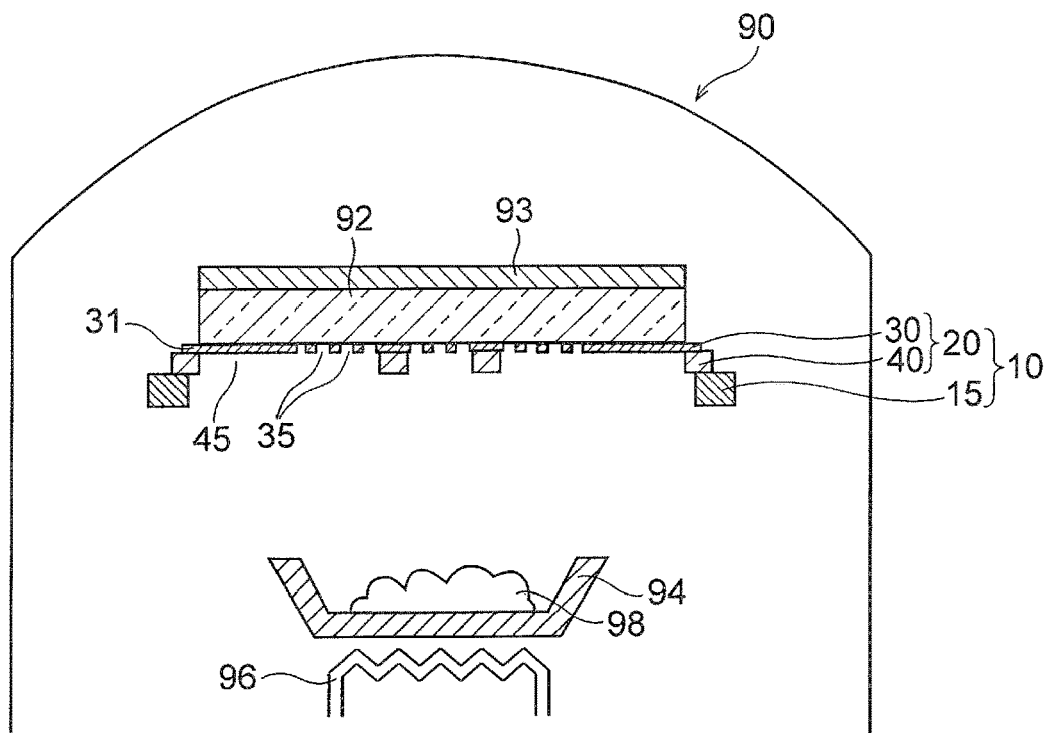
FIG. 15 is a diagram depicting a step of vapor-depositing a vapor deposition material onto the organic EL substrate.

Next, a vapor deposition method for a vapor deposition material for vapor-depositing the vapor deposition material 98 onto the organic EL substrate 92 by use of the vapor deposition mask device 10 obtained by the aforementioned steps will be described referring mainly to FIGS. 14(A) to 15.

First, as illustrated in FIG. 14(A), the vapor deposition mask device 10 obtained by the aforementioned steps may be prepared. In this instance, the heater 96 and the crucible 94 accommodating the vapor deposition material 98 may be prepared, and the vapor deposition device 90 may be prepared.

In addition, the organic EL substrate 92 may be prepared.

Next, as depicted in FIG. 14(B), the organic EL substrate 92 may be disposed on the mask main body 30 of the vapor deposition mask device 10. In this instance, the organic EL substrate 92 may be disposed on the vapor deposition mask device 10, for example, while an alignment mark (not illustrated) of the organic EL substrate 92 and an alignment mark (not illustrated) of the vapor deposition mask 20 are directly observed and the organic EL substrate 92 is positioned in such a manner that the alignment marks overlap with each other.

Next, the vapor deposition material 98 is vapor-deposited onto the organic EL substrate 92 disposed on the mask main body 30 of the vapor deposition mask device 10. In this instance, for example, as depicted in FIG. 15, a magnet 93 may be disposed on a surface of the organic EL substrate 92 on the side opposite to the side where the where the organic EL substrate 92 is disposed on the vapor deposition mask device 10. With the magnet 93 thus provided, the vapor deposition mask device 10 can be drawn toward the magnet 93 side by a magnetic force, and the mask main body 30 can be put into close contact with the organic EL substrate 92. Next, the inside of the vapor deposition device 90 may be evacuated to establish a vacuum state. Thereafter, the heater 96 heats the crucible 94 to evaporate the vapor deposition material 98. Then, the vapor deposition material 98 evaporated from the crucible 94 and reaching the vapor deposition mask device 10 passes through the second through-holes 45 of the support 40 and the first through-holes 35 of the mask main body 30, to be deposited on the organic EL substrate 92 (see FIG. 1).

In this way, the vapor deposition material 98 is vapor-deposited on the organic EL substrate 92 in a desired pattern corresponding to the positions of the first through-holes 35 of the mask main body 30.

According to the present embodiment, the mask main body 30 has the first alignment mark 34, while the support 40 has the second alignment mark 44. The first alignment mark 34 and the second alignment mark 44 are provided at such positions as to overlap with each other, and either one of them is larger than the other of them. As a result, by making the centers of the first alignment mark 34 and the second alignment mark 44 coincide with each other, the positions of the mask main body 30 and the support 40 can be aligned accurately. Since the mask main body 30 and the support 40 can thus be adhered accurately to each other, the first through-holes 35 of the mask main body 30 are accurately disposed in relation to the second through-holes 45 of the support 40. As a result, the positional accuracy of the vapor deposition material 98 after vapor deposition is enhanced, and an organic EL substrate 92 free of luminance unevenness or non-lighting can be produced.

According to the present embodiment, the first alignment mark 34 of the mask main body 30 is formed together with the first through-holes 35 in the step of forming the first through-holes 35, and the second alignment mark 44 is formed together with the second through-holes 45 in the step of forming the second through-holes 45, and therefore, it is unnecessary to separately provide a step of forming the alignment marks.

It is to be noted that various modifications may be added to the present embodiment. Modifications will be described below referring to the drawings as needed. In the following description and the drawings used in the following description, the parts configured similarly to those in the present embodiment will be denoted by the same reference symbols as used for those in the present embodiment, and repeated descriptions thereof will be omitted. In addition, in the case where it is clear that an effect obtained in the present embodiment is also obtained in a modification or modifications, the description of the effect may be omitted.

FIGS. 16 to 19 are diagrams depicting modifications of the first alignment mark and the second alignment mark. FIGS. 16 to 19 are diagrams illustrating a state in which the mask main body 30 and the support 40 are positioned, and are diagrams corresponding to FIG. 11 mentioned above.

Figure 16:
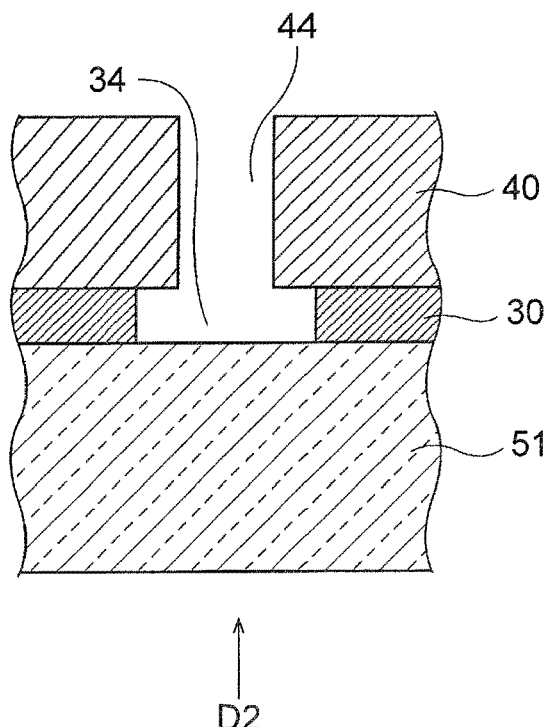
FIG. 16 is a diagram depicting a first modification of the first alignment mark and the second alignment mark according to the first embodiment.

In the embodiment described above, an exemplary case in which the second alignment mark 44 is larger than the first alignment mark 34 in plan view has been described. However, this is not limitative; as depicted in FIG. 16, the first alignment mark 34 may be larger than the second alignment mark 44 in plan view. In this case, the alignment between the first alignment mark 34 and the second alignment mark 44 can be performed from the side of the base material 51 which has a light-transmitting property (in the direction of arrow D2 in FIG. 16).

Figure 17:
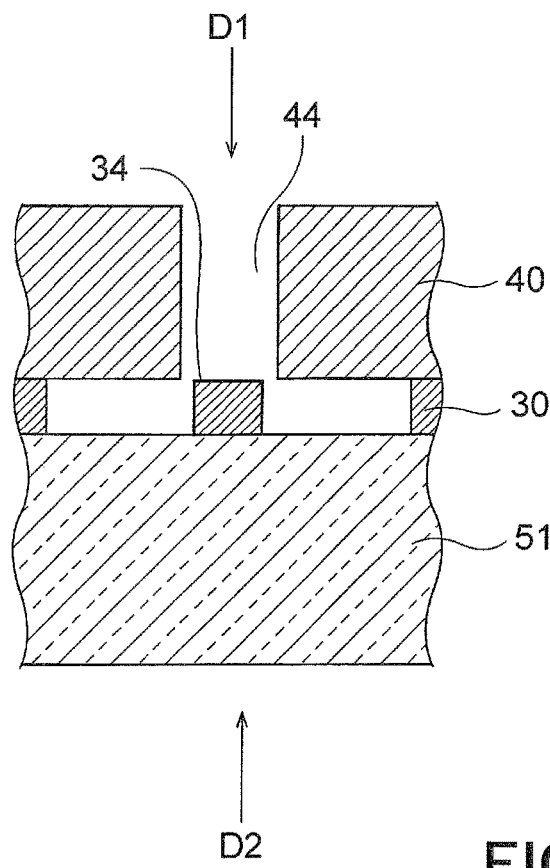
FIG. 17 is a diagram depicting a second modification of the first alignment mark and the second alignment mark according to the first embodiment.

In the embodiment described above, an exemplary case in which the first alignment mark 34 is a through-hole has been described. However, this is not limitative; as depicted in FIG. 17, the first alignment mark 34 may be an island-like projection formed on the base material 51. In this case, the first alignment mark 34 is formed from the plating layer 31, and is similar in shape to the second alignment mark 44 in plan view. For example, in the case where the second alignment mark 44 is circular in plan-view shape, the first alignment mark 34 may have a cylindrical shape. In FIG. 17, the second alignment mark 44 is larger than the first alignment mark 34 in plan view. In other words, the first alignment mark 34 is included in the second alignment mark 44 in plan view. In the case where the base material 51 is formed from a light-transmitting material (for example, a glass material), the alignment between the first alignment mark 34 and the second alignment mark 44 can be performed from either the support 40 side (in the direction of arrow D1 in FIG. 17) and the base material 51 side (in the direction of arrow D2 in FIG. 17). On the other hand, in the case where the base material 51 is formed from a non-light-transmitting material (for example, a metallic material) (see, for example, FIGS. 21(A) to 21(E) mentioned later), the alignment between the first alignment mark 34 and the second alignment mark 44 can be conducted from the support 40 side (the direction of arrow D1 in FIG. 17).

Figure 18:
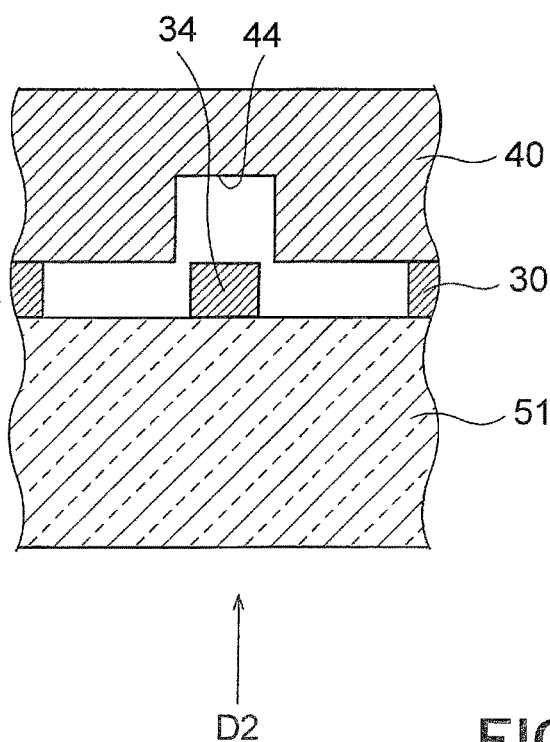
FIG. 18 is a diagram depicting a third modification of the first alignment mark and the second alignment mark according to the first embodiment.

In the embodiment described above, an exemplary case in which the second alignment mark 44 is a through-hole has been described. However, this is not limitative; as depicted in FIG. 18, the second alignment mark 44 may be a non-through-hole which is recessed to an intermediate position in the thickness direction of the support 40 and is opening to the mask main body 30 side. The second alignment mark 44 may be formed in the support 40 by, for example, half etching (a technique for etching to an intermediate position in the thickness direction of the support 40). On the other hand, the first alignment mark 34 is an island-like projection formed on the base material 51. The second alignment mark 44 is similar in shape to the first alignment mark 34 in plan view. For example, in the case where the second alignment mark 44 is circular in plan view shape, the first alignment mark 34 may have a cylindrical shape. In FIG. 18, the second alignment mark 44 is larger than the first alignment mark 34 in plan view. In this case, the alignment between the first alignment mark 34 and the second alignment mark 44 can be performed from the side of the base material 51 which has a light-transmitting property (in the direction of arrow D2 in FIG. 18). Thus, since the second alignment mark 44 is a non-through-hole, at the time of vapor-depositing the vapor deposition material 98 onto the organic EL substrate 92, the vapor deposition material 98 does not pass through the second alignment mark 44, and, therefore, the vapor deposition material 98 would not be deposited at unrequired positions on the organic EL substrate 92.

Figure 19:
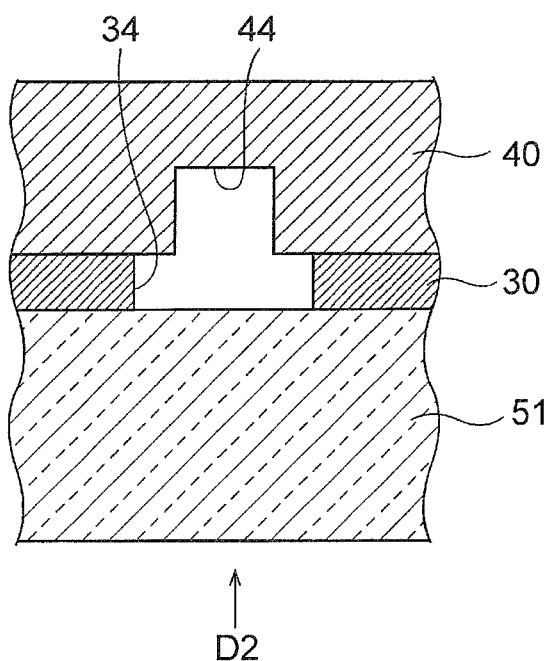
FIG. 19 is a diagram depicting a fourth modification of the first alignment mark and the second alignment mark according to the first embodiment.

As illustrated in FIG. 19, the second alignment mark 44 may be a non-through-hole which is recessed to an intermediate position in the thickness direction of the support 40 and is opening to the mask main body 30 side, while the first alignment mark 34 may be a through-hole. The second alignment mark 44 may be formed in the support 40 by, for example, half etching (a technique for etching to an intermediate position in the thickness direction of the support 40). The second alignment mark 44 is similar in shape to the first alignment mark 34 in plan view. In FIG. 19, the first alignment mark 34 is larger than the second alignment mark 44 in plan view. In this case, the alignment between the first alignment mark 34 and the second alignment mark 44 can be performed from the side of the base material 51 which has a light-transmitting property (in the direction of arrow D2 in FIG. 19). Thus, since the second alignment mark 44 is a non-through-hole, at the time of vapor depositing the vapor deposition material 98 onto the organic EL substrate 92, the vapor deposition material 98 does not pass through the second alignment mark 44, and, therefore, the vapor deposition material 98 would not be deposited at unrequired positions on the organic EL substrate 92.

Figure 20:
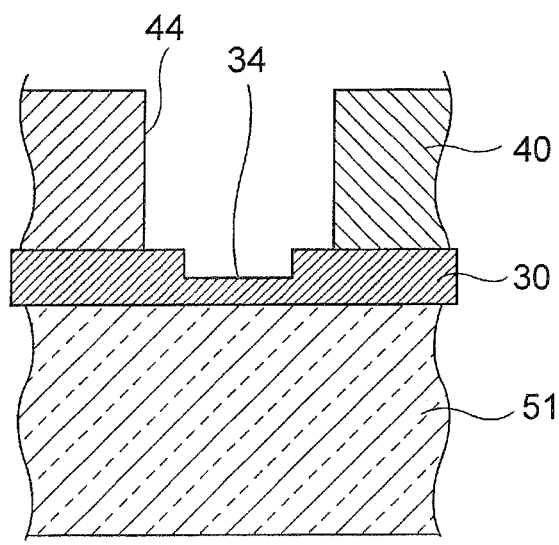
FIG. 20 is a diagram depicting a fifth modification of the first alignment mark and the second alignment mark according to the first embodiment.
Figure 21:
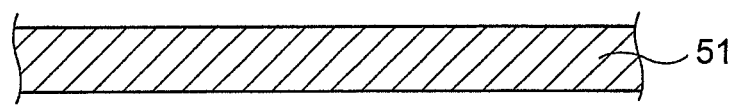
FIGS. 21(A) to 21(E) are sectional views depicting a modification of a method of manufacturing a mask main body according to the first embodiment.
Figure 21:
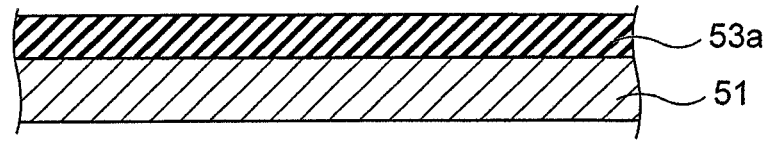
Figure 21:
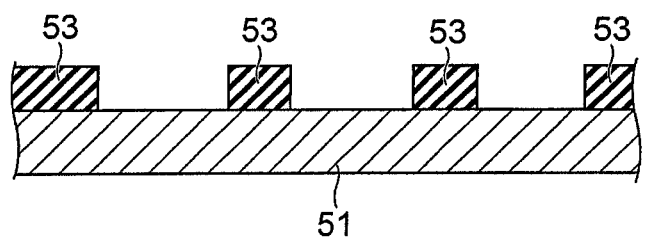
Figure 21:
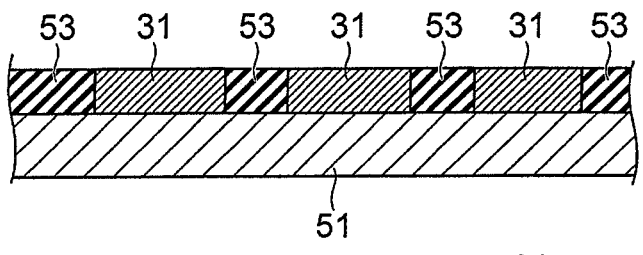
Figure 21:
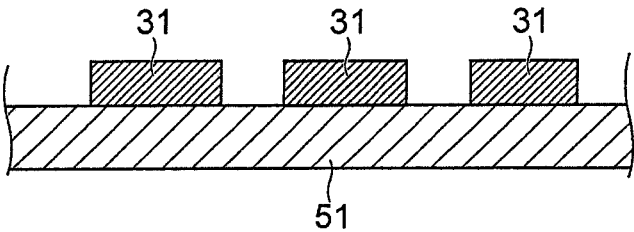

As depicted in FIG. 20, the first alignment mark 34 may be a non-through-hole which is recessed to an intermediate position in the thickness direction of the mask main body 30 and is opening to the support 40 side, while the second alignment mark 44 may be a through-hole. The first alignment mark 34 may be similar in shape to the second alignment mark 44 in plan view. In FIG. 20, the second alignment mark 44 is larger than the first alignment mark 34 in plan view. In this case, the alignment between the first alignment mark 34 and the second alignment mark 44 can be conducted from the support 40 side. It is to be noted that the second alignment mark 44 may have an island-like projection (see FIG. 17).

In the embodiment described above, an exemplary case in which the plating layer 31 is precipitated on the conductive pattern 52 has been described. However, this is not limitative, and the plating layer 31 may be precipitated directly on the base material 51. In this case, first, the base material 51 formed from a conductive material, for example, stainless steel or brass steel, is prepared (FIG. 21(A)). Subsequently, a resist 53a is applied onto the conductive base material 51, and is dried (FIG. 21(B)). Next, the base material 51 is exposed to light through a photomask, followed by development, to form a resist pattern 53 having a predetermined pattern, on the base material 51 (FIG. 21(C)). Subsequently, as depicted in FIG. 21(D), a plating liquid is supplied onto the base material 51 formed with the resist pattern 53, to precipitate a plating layer 31 on the base material 51. Thereafter, as illustrated in FIG. 21(E), the resist pattern 53 is removed, whereby the plating layer 31 can be precipitated on the base material 51. It is to be noted that, though not illustrated, a two-layer structure in which the plating layer 31 has a second metallic layer 37 provided on the first metallic layer 32 may be formed.

Next, a second embodiment will be described referring to FIGS. 22 to 32(H). FIGS. 22 to 32(H) are diagrams depicting the second embodiment. In FIGS. 22 to 32(H), the same parts as those in the first embodiment depicted in FIGS. 1 to 21(E) are denoted by the same reference symbols, and detailed description of them will be omitted. It is to be noted that in the following, the differences from the first embodiment will primarily be described.

First, the configuration of a vapor deposition mask according to the present embodiment will be described referring to FIGS. 22 to 25.

Figure 22:
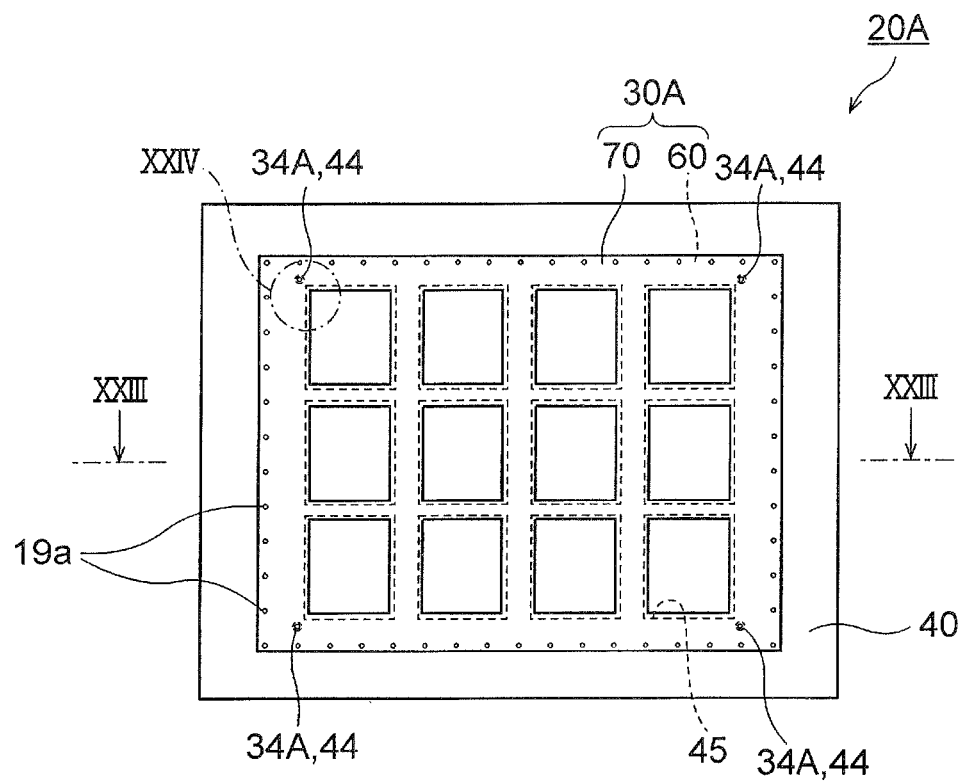
FIG. 22 is a plan view depicting a vapor deposition mask according to a second embodiment.
Figure 23:
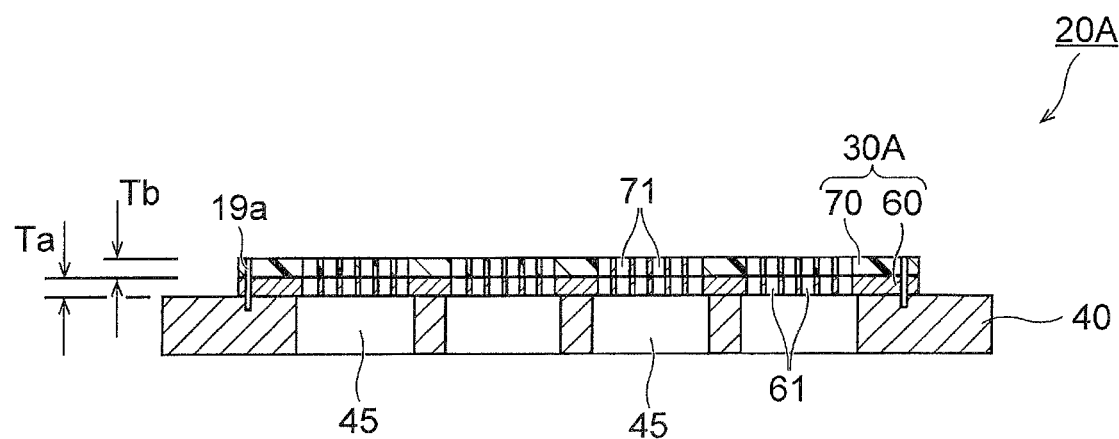
FIG. 23 is a sectional view (a sectional view taken along line XXIII-XXIII of FIG. 22) depicting the vapor deposition mask according to the second embodiment.

As illustrated in FIGS. 22 and 23, a vapor deposition mask 20A according to the present embodiment may include a metallic layer (metallic mask) 60 provided with slits 61, and a resin mask 70 which is stacked on the metallic layer 60 and is provided with a plurality of openings 71 corresponding to a pattern to be produced by vapor deposition. In addition, a support 40 may be joined to the metallic layer 60. It is to be noted that the metallic layer 60 and the resin mask 70 stacked on each other may constitute a mask main body 30A.

The vapor deposition mask 20A is used for simultaneously forming vapor deposition patterns for a plurality of screens, and vapor deposition patterns corresponding to a plurality of products can be formed simultaneously by one vapor deposition mask 20A. Here, the "opening" means a pattern intended to be produced using the vapor deposition mask 20A; for example, in the case of using the vapor deposition mask for forming an organic layer in an organic EL display, the shape of the openings 71 is the shape of the organic layer. In addition, the "one screen" includes an aggregate of the openings 71 corresponding to one product, and, in the case where the one product is the organic EL display, the aggregate of the organic layers required for forming one organic EL display, i.e., the aggregate of the openings 71 to be organic layers, is the "one screen." For simultaneously forming the vapor deposition patterns for a plurality of screens by the vapor deposition mask 20A, the resin mask 70 is provided with the "one screen" in the number for a plurality of screens at predetermined intervals. In other words, the resin mask 70 is provided with the openings 71 necessary for configuring a plurality of screens.

The metallic layer 60 of the mask main body 30A may be provided on a surface on one side of the resin mask 70 (a surface on the support 40 side). The metallic layer 60 is rectangular in shape in plan view. The metallic layer 60 may be formed with a plurality of slits 61. The shape of the slits 61 may be substantially polygonal in plan view. An example in which the slits 61 are substantially tetragonal in shape, more specifically, substantially square in shape, is illustrated here. Though not illustrated, the shape of the slits 61 may be other substantially polygonal shapes, such as a substantially hexagonal shape or a substantially octagonal shape. It is to be noted that the "substantially polygonal shape" is a concept including shapes in which corner parts of polygons are rounded. Though not illustrated, the shape of the slits 61 may be circular. It is to be noted that the slit 61 has the same meaning as opening.

The slits 61 may be provided at such positions as to overlap with the openings 71. In this case, one opening 71 may be disposed inside one slit 61 in plan view. A layout example of the slits 61 is not particularly limited; the slits 61 may be arrayed in plurality in a column direction and in a row direction, the slits 61 extending in the column direction may be arrayed in plurality in the row direction, or the slits 61 extending in the row direction may be arrayed in plurality in the column direction. Alternatively, the slits 61 may be arrayed in only one line in the column direction or in the row direction.

The material of the metallic layer 60 is not particularly limited, and materials known in the field of vapor deposition masks can appropriately be selected and used; examples of the material which can be used include metallic materials such as stainless steel, iron-nickel alloy, and aluminum alloys. Among others, the invar material which is an iron-nickel alloy can be used preferably, since it is insusceptible to deformation under heat.

The thickness Ta of the metallic layer 60 is not particularly limited; for more effective prevention of generation of shadow, however, the thickness Ta is preferably equal to or less than 100 μm, more preferably equal to or less than 50 μm, and particularly preferably equal to or less than 35 μm. It is to be noted that, with the thickness Ta of the metallic layer 60 set to be thicker than 5 μm, the risk of breakage or deformation of the metallic layer 60 can be lowered, and handleability can be secured. It is to be noted that the shadow refers to a phenomenon in which part of the vapor deposition material released from a vapor deposition source collides against inner wall surfaces of the slits 61 of the metallic layer 60 and fails to reach the object of vapor deposition, whereby non-deposition parts where the film thickness is smaller than the target thickness of vapor deposition film are generated. Particularly, the influence of the shadow is increased as the shape of the openings 71 is made finer.

The resin mask 70 of the mask main body 30A may be provided on a surface on one side of the metallic layer 60 (a surface on the side opposite to the support 40 side). The resin mask 70 has a rectangular shape in plan view. In this case, the resin mask 70 has the same outer shape as the metallic layer 60, but this is not limitative, and the resin mask 70 and the metallic layer 60 may have different outer shapes.

The resin mask 70 may be provided with the openings 71 required for configuring a plurality of screens. The plurality of openings 71 may be provided at such positions as to overlap with the slits 61 of the metallic layer 60 when the metallic layer 60 and the resin mask 70 are stacked on each other. The openings 71 may each be substantially polygonal in shape in plan view. An example in which the openings 71 are substantially tetragonal in shape, more specifically substantially square in shape, is depicted here. Though not illustrated, the openings 71 may have other substantially polygonal shapes, such as a substantially hexagonal shape or a substantially octagonal shape. Though not illustrated, the openings 71 may be circular in shape.

The material of the resin mask 70 is not particularly limited, and known resin materials can appropriately be selected and used. It is preferable, however, to use a material which permits formation of highly precise openings 71 by laser processing or the like, which has small dimensional variation rate and hygroscopicity under heat or with time, and which is light in weight. Examples of such a material include polyimide resin, polyamide resin, polyamide-imide resin, polyester resin, polyethylene resin, polyvinyl alcohol resin, polypropylene resin, polycarbonate resin, polystyrene resin, polyacrylonitrile resin, ethylene-vinyl acetate copolymer resin, ethylene-vinyl alcohol copolymer resin, ethylene-methacrylic acid copolymer resin, polyvinyl chloride resin, polyvinylidene chloride resin, cellophane, and ionomer resin. Among the above-mentioned examples of materials, resin materials having a thermal expansion coefficient of equal to or less than 16 ppm/° C. are preferable, resin materials having a hygroscopicity of equal to or less than 1.0% are preferable, and resin materials having both of these conditions are particularly preferable. With the resin material used to obtain the resin mask, the dimensional accuracy of the openings 71 can be enhanced, and dimensional variation rate and hygroscopicity under heat or with time can be reduced.

The thickness Tb of the resin mask 70 is not particularly limited. The thickness Tb of the resin mask 70 may be, for example, equal to or more than 3 μm, may be equal to or more than 4 μm, may be equal to or more than 6 μm, or may be equal to or more than 8 μm. The thickness Tb of the resin mask 70 may be, for example, equal to or less than 10 μm, may be equal to or less than 15 μm, may be equal to or less than 20 μm, or may be equal to or less than 25 μm. The range of the thickness Tb of the resin mask 70 may be defined by a first group consisting of 3 μm 4 μm, 6 μm, and 8 μm and/or a second group consisting of 10 μm, 15 μm, 20 μm, and 25 μm. The range of the thickness Tb of the resin mask 70 may be defined by a combination of any one of the values included in the first group and anyone of the values included in the second group. The range of the thickness Tb of the resin mask 70 may be defined by a combination of any two of the values included in the first group. The range of the thickness Tb of the resin mask 70 may be defined by a combination of any two of the values included in the second group. For example, the thickness Tb of the resin mask 70 may be not less than 3 μm and not more than 25 μm, may be not less than 3 μm and not more than 20 μm, may be not less than 3 μm and not more than 15 μm, may be not less than 3 μm and not more than 10 μm, may be not less than 3 μm and not more than 8 μm, may be not less than 3 μm and not more than 6 μm, may be not less than 3 μm and not more than 4 μm, may be not less than 4 μm and not more than 25 μm, may be not less than 4 μm and not more than 20 μm, may be not less than 4 μm and not more than 15 μm, may be not less than 4 μm and not more than 10 μm, may be not less than 4 μm and not more than 8 μm, may be not less than 4 μm and not more than 6 μm, may be not less than 6 μm and not more than 25 μm, may be not less than 6 μm and not more than 20 μm, may be not less than 6 μm and not more than 15 μm, may be not less than 6 μm and not more than 10 μm, may be not less than 6 μm and not more than 8 μm, may be not less than 8 μm and not more than 25 μm, may be not less than 8 μm and not more than 20 μm, may be not less than 8 μm and not more than 15 μm, may be not less than 8 μm and not more than 10 μm, may be not less than 10 μm and not more than 25 μm, may be not less than 10 μm and not more than 20 μm, may be not less than 10 μm and not more than 15 μm, may be not less than 15 μm and not more than 25 μm, may be not less than 15 μm and not more than 20 μm, or may be not less than 20 μm and not more than 25 μm. With the thickness Tb of the resin mask 70 set within this range, defects such as pinholes and the risk of deformation or the like can be reduced, and generation of shadow can be prevented effectively. Particularly, with the thickness Tb of the resin mask 70 set to be not less than 3 μm but not more than 10 μm, more preferably not less than 4 μm but not more than 8 μm, the influence of shadow at the time of forming a high-definition pattern in excess of 400 ppi can be prevented more effectively.

The support 40 may be provided on a surface on one side of the metallic layer 60 (a surface on the side opposite to the resin mask 70 side). The support 40 may be formed with a plurality of second through-holes 45, and the second through-holes 45 may each be formed in a size corresponding to one screen. In the second through-holes 45, a plurality of slits 61 and a plurality of openings 71 may be disposed such as to overlap with each other in plan view.

It is to be noted that the configuration of the support 40 is substantially the same as that in the case of the first embodiment, and, therefore, detailed description thereof is omitted here. Though not illustrated, a vapor deposition mask device including a mask main body 30A, a support 40, and a frame 15 may be configured by further providing the frame 15, similar to that in the case of the first embodiment, on a surface on one side of the support 40 (a surface on the side opposite to the metallic layer 60 side).

Figure 24:
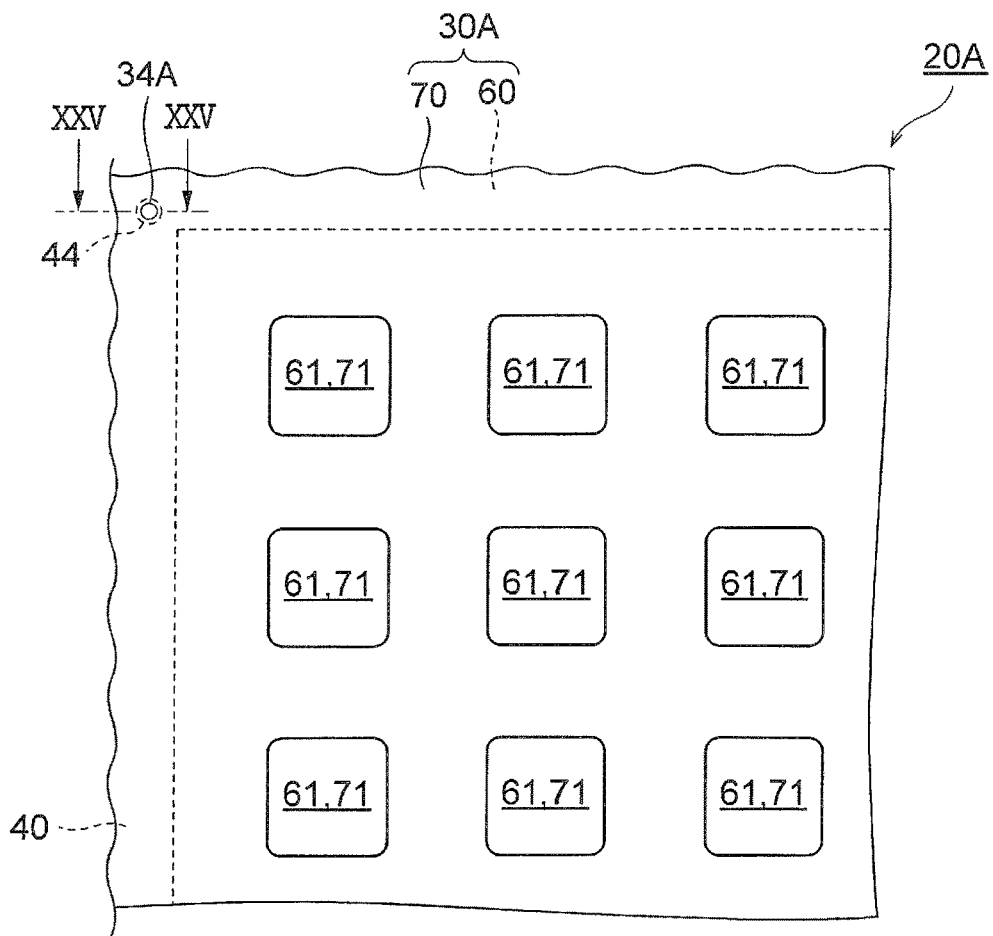
FIG. 24 is a partial enlarged view (an enlarged view of part XXIV of FIG. 22) depicting the vapor deposition mask according to the second embodiment.
Figure 25:
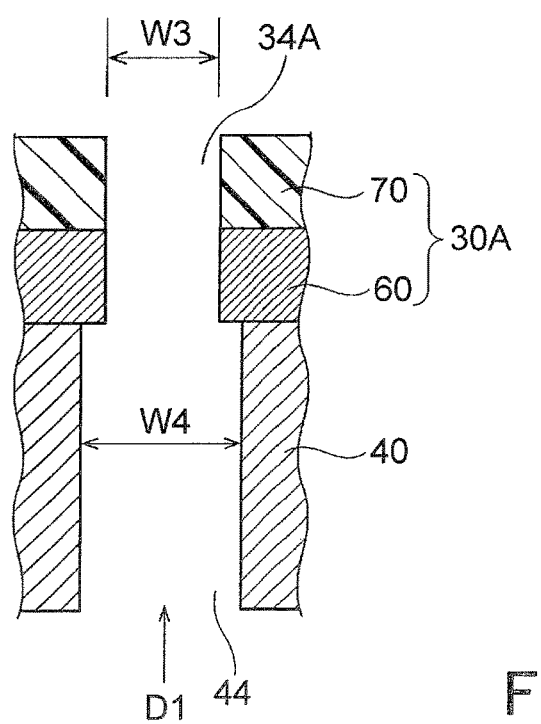
FIG. 25 is a partial sectional view (a sectional view taken along line XXV-XXV of FIG. 22) depicting the vapor deposition mask according to the second embodiment.
Figure 26:
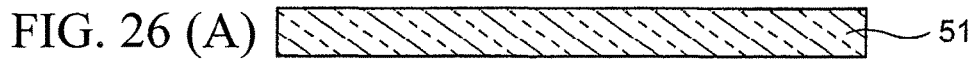
FIGS. 26(A) to 26(H) are sectional views depicting a method of manufacturing a vapor deposition mask according to the second embodiment.
Figure 26:
Figure 26:
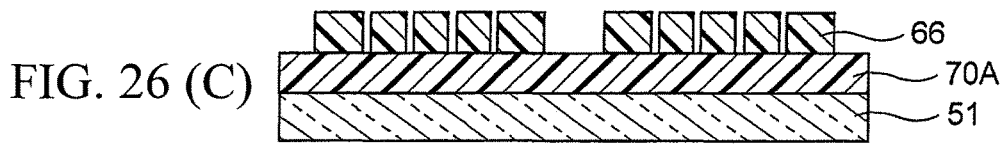
Figure 26:
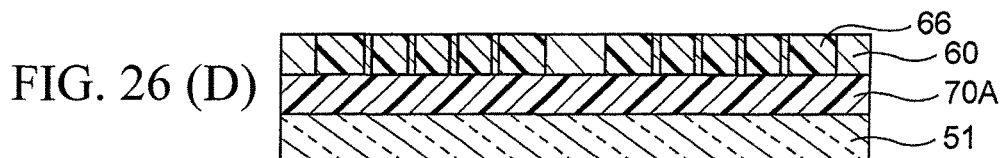
Figure 26:
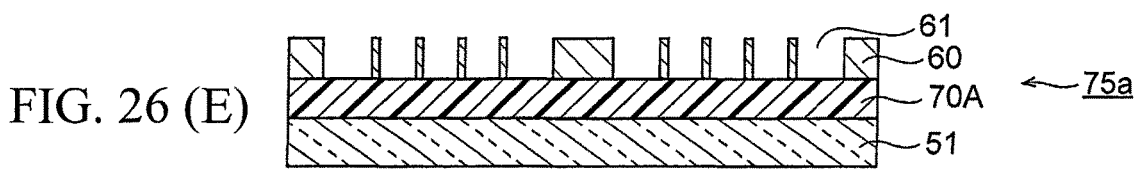
Figure 26:
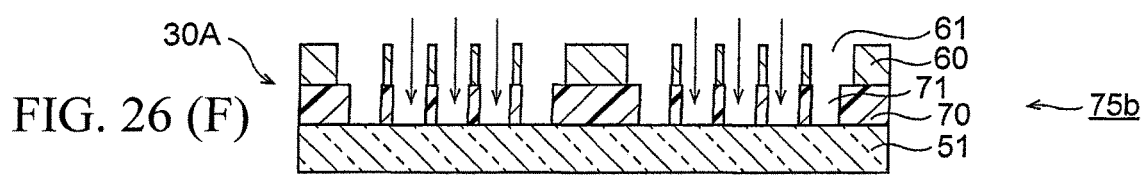
Figure 26:
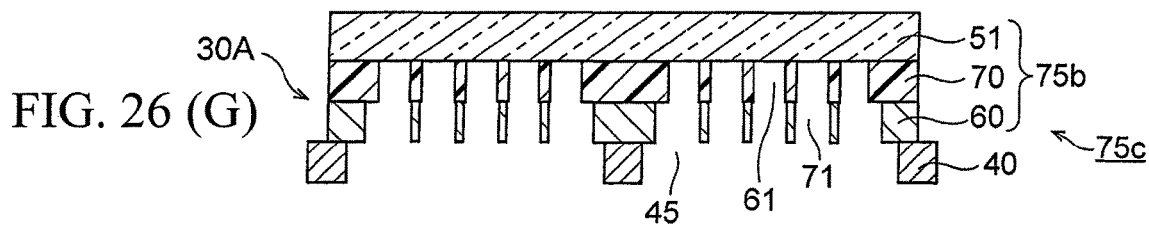
Figure 26:
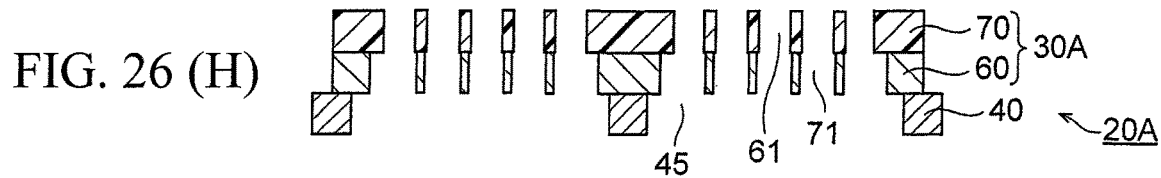
Figure 27:
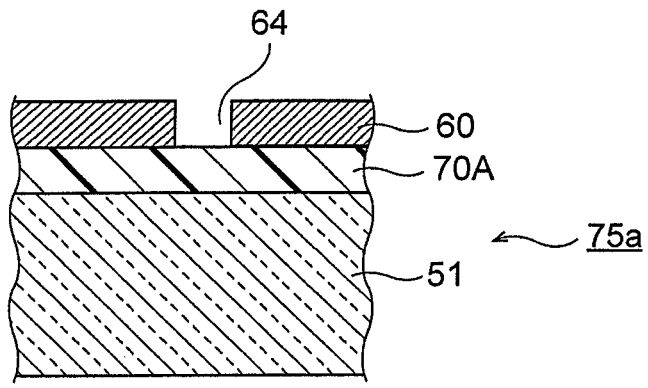
FIGS. 27(A) to 27(C) are sectional views depicting the first alignment mark and the second alignment mark during manufacture of the vapor deposition mask.
Figure 27:
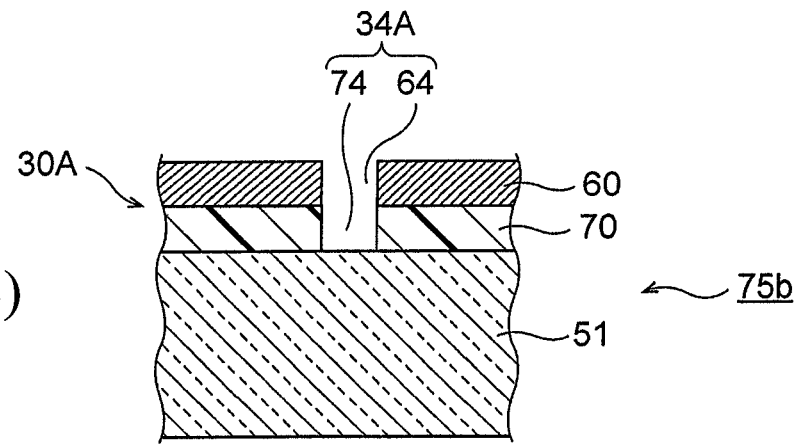
Figure 27:
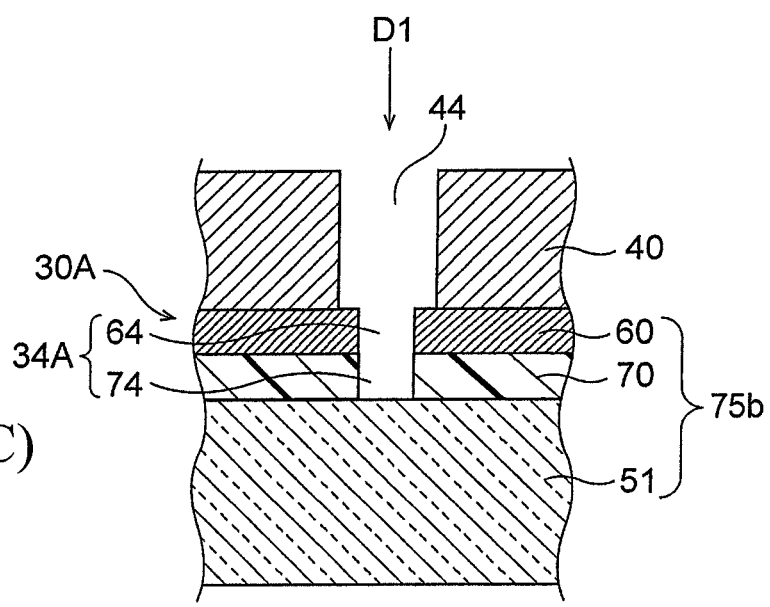

As illustrated in FIGS. 24 and 25, the mask main body 30A of the vapor deposition mask 20 has the first alignment mark 34A, while the support 40 has the second alignment mark 44. The first alignment mark 34A and the second alignment mark 44 are provided for accurately positioning the metallic layer 60 and the resin mask 70 of the second intermediate 75b and the support 40, as will be described later. When the metallic layer 60 and the resin mask 70 of the second intermediate 75b and the support 40 are accurately positioned, the centers of the first alignment mark 34A and the second alignment mark 44 may coincide with each other. Therefore, the first alignment mark 34A and the second alignment mark 44 may be provided at such positions as to overlap with each other in plan view. The first alignment mark 34A and the second alignment mark 44 may be different from each other in size; specifically, the second alignment mark 44 may be larger than the first alignment mark 34A.

In this case, the first alignment mark 34A may be a through-hole which penetrates the metallic layer 60 and the resin mask 70 constituting the mask main body 30A in their thickness direction. The second alignment mark 44 may be a through-hole which penetrates the support 40 in its thickness direction. For this reason, when viewed from the support 40 side (in the direction of arrow D1 in FIG. 25), the first alignment mark 34A which is a through-hole may be included inside the second alignment mark 44 which is a through-hole. Therefore, when the metallic layer 60 and the resin mask 70 and the support 40 are accurately positioned, an outer edge of the first alignment mark 34A may entirely be located inside the second alignment mark 44.

The shapes of the first alignment mark 34A and the second alignment mark 44 may each be a circle in plan view.

The diameter (width) W4 of the second alignment mark 44 may be, for example, equal to or more than 0.15 mm, may be equal to or more than 0.3 mm, may be equal to or more than 0.5 mm, or may be equal to or more than 0.8 mm. The diameter (width) W4 of the second alignment mark 44 may be, for example, equal to or less than 1.0 mm, may be equal to or less than 1.5 mm, may be equal to or less than 2.0 mm, or may be equal to or less than 2.5 mm. The range of the diameter (width) W4 of the second alignment mark 44 may be defined by a first group consisting of 0.15 mm, 0.3 mm, 0.5 mm, and 0.8 mm and/or a second group consisting of 1.0 mm, 1.5 mm, 2.0 mm, and 2.5 mm. The range of the diameter (width) W4 of the second alignment mark 44 may be defined by a combination of any one of the values included in the first group and any one of the values included in the second group. The range of the diameter (width) W4 of the second alignment mark 44 may be defined by a combination of any two of the values included in the first group. The range of the diameter (width) W4 of the second alignment mark 44 may be defined by a combination of any two of the values included in the second group. For example, the range of the diameter (width) W4 of the second alignment mark 44 may be not less than 0.15 mm and not more than 2.5 mm, may be not less than 0.15 mm and not more than 2.0 mm, may be not less than 0.15 mm and not more than 1.5 mm, may be not less than 0.15 mm and not more than 1.0 mm, may be not less than 0.15 mm and not more than 0.8 mm, may be not less than 0.15 mm and not more than 0.5 mm, may be not less than 0.15 mm and not more than 0.3 mm, may be not less than 0.3 mm and not more than 2.5 mm, may be not less than 0.3 mm and not more than 2.0 mm, may be not less than 0.3 mm and not more than 1.5 mm, may be not less than 0.3 mm and not more than 1.0 mm, may be not less than 0.3 mm and not more than 0.8 mm, may be not less than 0.3 mm and not more than 0.5 mm, may be not less than 0.5 mm and not more than 2.5 mm, may be not less than 0.5 mm and not more than 2.0 mm, may be not less than 0.5 mm and not more than 1.5 mm, may be not less than 0.5 mm and not more than 1.0 mm, may be not less than 0.5 mm and not more than 0.8 mm, may be not less than 0.8 mm and not more than 2.5 mm, may be not less than 0.8 mm and not more than 2.0 mm, may be not less than 0.8 mm and not more than 1.5 mm, may be not less than 0.8 mm and not more than 1.0 mm, may be not less than 1.0 mm and not more than 2.5 mm, may be not less than 1.0 mm and not more than 2.0 mm, may be not less than 1.0 mm and not more than 1.5 mm, may be not less than 1.5 mm and not more than 2.5 mm, may be not less than 1.5 mm and not more than 2.0 mm, or may be not less than 2.0 mm and not more than 2.5 mm.

The diameter (width) W3 of the first alignment mark 34A may be, for example, equal to or more than 2%, may be equal to or more than 5%, may be equal to or more than 10%, or equal to or more than 20%, of the diameter (width) W4 of the second alignment mark 44. The ratio of W3 to W4 may be, for example, equal to or less than 40%, may be equal to or less than 60%, may be equal to or less than 80%, or may be equal to or less than 98%. The range of the ratio of W3 to W4 may be defined by a first group consisting of 2%, 5%, 10%, and 20% and/or a second group consisting of 40%, 60%, 80%, and 98%. The range of the ratio of W3 to W4 may be defined by a combination of any one of the values included in the first group and any one of the values included in the second group. The range of the ratio of W3 to W4 may be defined by a combination of any two of the values included in the first group. The range of the ratio of W3 to W4 may be defined by a combination of any two of the values included in the second group. For example, the ratio of W3 to W4 may be not less than 2% and not more than 98%, may be not less than 2% and not more than 80%, may be not less than 2% and not more than 60%, may be not less than 2% and not more than 40%, may be not less than 2% and not more than 20%, may be not less than 2% and not more than 10%, may be not less than 2% and not more than 5%, may be not less than 5% and not more than 98%, may be not less than 5% and not more than 80%, may be not less than 5% and not more than 60%, may be not less than 5% and not more than 40%, may be not less than 5% and not more than 20%, may be not less than 5% and not more than 10%, may be not less than 10% and not more than 98%, may be not less than 10% and not more than 80%, may be not less than 10% and not more than 60%, may be not less than 10% and not more than 40%, may be not less than 10% and not more than 20%, may be not less than 20% and not more than 98%, may be not less than 20% and not more than 80%, may be not less than 20% and not more than 60%, may be not less than 20% and not more than 40%, may be not less than 40% and not more than 98%, may be not less than 40% and not more than 80%, may be not less than 40% and not more than 60%, may be not less than 60% and not more than 98%, may be not less than 60% and not more than 80%, or may be not less than 80% and not more than 98%.

The shapes of the first alignment mark 34A and the second alignment mark 44 in plan view are not each limited to a circle, and may be an ellipse, a polygon, a cross, or the like. In this case, the shapes of the first alignment mark 34A and the second alignment mark 44 in plan view are similar to each other, but this is not limitative; the shapes may be non-similar shapes (for example, a circle and a polygon).

As illustrated in FIG. 22, the first alignment mark 34A and the second alignment mark 44 may be formed outside a region that constitutes one screen, of the vapor deposition mask 20. Specifically, the first alignment mark 34A and the second alignment mark 44 may each be disposed in the number of a total of four, in the four corners of the mask main body 30A. However, the layout positions and numbers of the first alignment marks 34A and the second alignment marks 44 are not limited to these ones, insofar as they are each provided in the number of one or more at such a position or positions that the mask main body 30A and the support 40 overlap with each other.

Next, a method of manufacturing the vapor deposition mask according to the present embodiment will be described referring to FIGS. 26(A) to 26(H). FIGS. 26(A) to 26(H) are step diagrams for explaining the method of manufacturing the vapor deposition mask according to the present embodiment.

First, as depicted in FIG. 26(A), a base material 51 may be prepared. As the base material 51, there may be used a glass, a synthetic resin, a metal, and the like, similarly to the case of the first embodiment. An example in which a light-transmitting glass material is used as the base material 51 will be described here.

Next, as illustrated in FIG. 26(B), a resin layer 70A may be formed on the base material 51. The resin layer 70A is for producing the resin mask 70 of the vapor deposition mask 20A mentioned above. Specifically, a resin solution, for example, a polyimide varnish is applied to substantially the whole area of a surface of the base material 51, and is dried by heating, whereby the resin layer 70A is obtained. The thickness at which the resin solution is applied may be, for example, not less than 2 μm but not more than 30 μm.

Subsequently, as depicted in FIG. 26(C), a photosensitive resist may be applied onto the resin layer 70A, followed by drying. Then, the photosensitive resist may be exposed to light through a photomask, followed by development, to form a resist layer 66 having a pattern corresponding to slits 61. It is to be noted that, though not illustrated in FIG. 26(C), the resist layer 66 may be formed also at a position corresponding to a first alignment mark 34A.

Next, as illustrated in FIG. 26(D), a seed layer (not illustrated) formed from a metal such as nickel or palladium may be formed on the resin layer 70A, and thereafter, electroplating may be applied to the base material 51 and the resin layer 70A. By this, a metal such as nickel or a nickel alloy may be precipitated on those parts of the seed layer formed on the resin layer 70A at which the resist layer 66 is absent, to form a metallic layer 60.

Subsequently, as illustrated in FIG. 26(E), the resist layer 66 and the seed layer may be sequentially removed, to form the metallic layer 60, which is provided with the slits 61, on the resin layer 70A. In this way, a first intermediate 75a including the metallic layer 60 provided with the slits 61, the resin layer 70A stacked on the metallic layer 60, and the base material 51 stacked on the resin layer 70A is obtained. In this instance, the metallic layer 60 may be formed with a through-hole 64 penetrating the metallic layer 60 in its thickness direction (see FIG. 27(A)). The through-hole 64 may constitute part of the first alignment mark 34A.

Next, as depicted in FIG. 26(F), the resin layer 70A of the first intermediate 75a may be irradiated with laser from the metallic layer 60 side (see arrow in FIG. 26(F)), to form openings 71 corresponding to a pattern to be produced by vapor deposition. As a result, the resin mask 70 provided with the openings 71 can be obtained. As the laser, there can be used, for example, KrF excimer laser of a wavelength of 248 nm or YAG laser of a wavelength of 355 nm. In this case, the openings 71 may be formed by a laser processing method using what is generally called a reduction projection optical system, in which a laser mask (not illustrated) corresponding to the pattern to be produced by vapor deposition is used, and a condenser lens is disposed between the laser mask and the first intermediate 75a. In this way, a second intermediate 75b including the metallic layer 60 provided with the slits 61, the resin mask 70 provided with the openings 71, and the base material 51 stacked on resin mask 70 is obtained.

In this instance, the resin mask 70 may be formed with a through-hole 74 which penetrates the resin mask 70 in its thickness direction (see FIG. 27(B)). The through-hole 74 in the resin mask 70 and the through-hole 64 in the metallic layer 60 may form the first alignment mark 34A. It is to be noted that, in FIG. 27(B), the through-hole 74 in the resin mask 70 and the through-hole 64 in the metallic layer 60 have the same diameter, but this is not limitative; the diameter of the through-hole 74 in the resin mask 70 may be smaller than the diameter of the through-hole 64 in the metallic layer 60.

Next, as illustrated in FIG. 26(G), a support 40 may be prepared, and the support 40 may be joined to the metallic layer 60 of the second intermediate 75b. In this instance, the support 40 and the metallic layer 60 may be joined to each other such that the second through-hole 45 in the support 40 overlaps with the slits 61 in the metallic layer 60 and the openings 71 in the resin mask 70 in plan view. In this instance, first, the second intermediate 75b is disposed on the support 40, while the second intermediate 75b and the support 40 are positioned accurately. During this, as depicted in FIG. 27(C), the positions of the first alignment mark 34A of the second intermediate 75b and the second alignment mark 44 of the support 40 may be aligned with each other, and the centers of the first alignment mark 34A and the second alignment mark 44 may be made to coincide with each other, to adjust the positions of the second intermediate 75b and the support 40. Other than this, a step of preparing the support 40 and a step of joining the support 40 can be performed similarly to the case of the first embodiment. In this way, a third intermediate 75c which includes the base material 51, the mask main body 30A joined to the base material 51, and the support 40 joined to the mask main body 30A is obtained. In the present embodiment, such a third intermediate (intermediate) 75c may also be provided.

Thereafter, as illustrated in FIG. 26(H), the base material 51 is removed from the resin layer 70A. Specifically, irradiation with laser is conducted from the base material 51 side of the third intermediate 75c, to thereby exfoliate the base material 51 from the resin layer 70A. As a result, the vapor deposition mask 20A including the mask main body 30A and the support 40 joined to the mask main body 30A is obtained.

It is to be noted that a method of manufacturing an organic EL display device by a vapor deposition method using the vapor deposition mask 20A according to the present embodiment is similar to that in the case of the first embodiment.

According to the present embodiment, the mask main body 30A has the first alignment mark 34A, while the support 40 has the second alignment mark 44. The first alignment mark 34A and the second alignment mark 40 are provided at such positions as to overlap with each other in plan view, and either one of them is larger than the other of them. As a result, by aligning the centers of the first alignment mark 34A and the second alignment mark 44, the positions of the metallic layer 60 and the resin mask 70 and the support 40 can accurately be aligned. Since the metallic layer 60 and the resin mask 70 and the support 40 can thus accurately be adhered to one another, the slits 61 in the metallic layer 60 and the openings 71 in the resin layer 70 are accurately disposed in relation to the second through-hole 45 of the support 40. As a result, the positional accuracy of the vapor deposition material 98 after vapor deposition is enhanced, and an organic EL substrate 92 free of luminance unevenness or non-lighting or the like can be produced.

It is to be noted that various modifications may be added to the present embodiment. Modifications will be described below referring to the drawings as required. In the following description and the drawings used in the following description, the parts configured similarly to those in the present embodiment will be denoted by the same reference symbols as used for those in the present embodiment, and repeated descriptions thereof will be omitted. In addition, in the case where it is clear that an effect obtained in the present embodiment is also obtained in a modification or modifications, the description of the effect may be omitted.

FIGS. 28 to 31 are diagrams depicting modifications of the first alignment mark and the second alignment mark. FIGS. 28 to 31 are diagrams depicting a state in which the second intermediate 75b and the support 40 are positioned, and are diagrams corresponding to FIG. 27(C) mentioned above.

Figure 28:
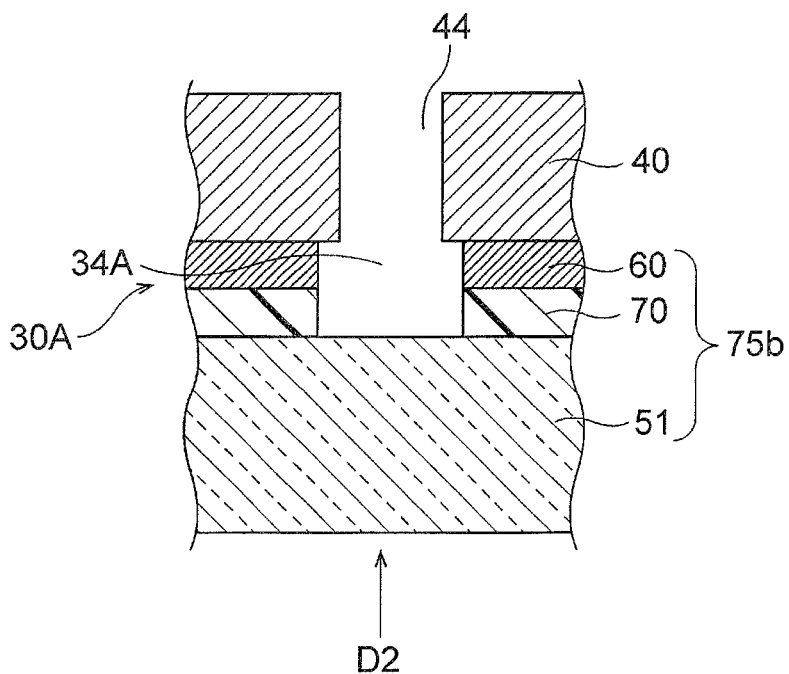
FIG. 28 is a diagram depicting a first modification of the first alignment mark and the second alignment mark according to the second embodiment.

In the embodiment described above, an exemplary case in which the second alignment mark 44 is larger than the first alignment mark 34A in plan view has been described. However, this is not limitative; as depicted in FIG. 28, the first alignment mark 34A may be larger than the second alignment mark 44 in plan view. In this case, the alignment between the first alignment mark 34A and the second alignment mark 44 can be performed from the side of the base material 51 which has a light-transmitting property (in the direction of arrow D2 in FIG. 28).

Figure 29:
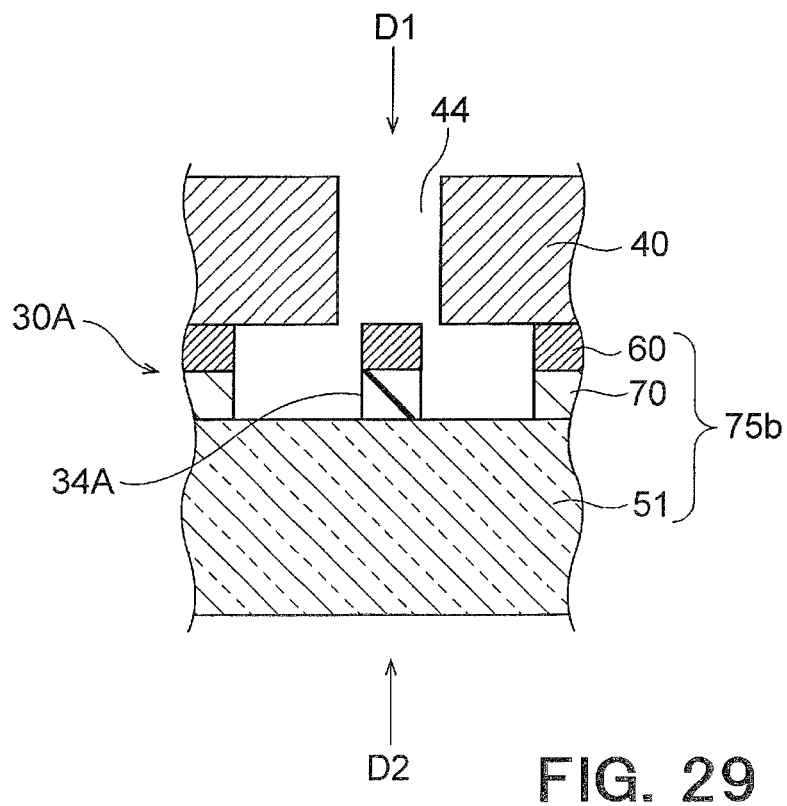
FIG. 29 is a diagram depicting a second modification of the first alignment mark and the second alignment mark according to the second embodiment.

In the embodiment described above, an exemplary case in which the first alignment mark 34 is a through-hole has been described. However, this is not limitative; as depicted in FIG. 29, the first alignment mark 34A may be an island-like projection formed on the base material 51. In this case, the first alignment mark 34A is formed from parts of the metallic layer 60 and the resin mask 70 (mask main body 30A), and is similar in shape to the second alignment mark 44 in plan view. For example, in the case where the second alignment mark 44 is circular in plan-view shape, the first alignment mark 34A may have a cylindrical shape. In other words, the first alignment mark 34A is included in the second alignment mark 44 in plan view. In FIG. 29, the second alignment mark 44 is larger than the first alignment mark 34A in plan view. In the case where the base material 51 is produced from a light-transmitting material (for example, a glass material), the alignment between the first alignment mark 34A and the second alignment mark 44 can be conducted from either the support 40 side (in the direction of arrow D1 in FIG. 29) and the base material 51 side (in the direction of D2 in FIG. 29). On the other hand, in the case where the base material 51 is produced from a non-light-transmitting material (for example, a metallic material), the alignment between the first alignment mark 34A and the second alignment mark 44 can be performed from the support 40 side (in the direction of arrow D1 in FIG. 29).

Figure 30:
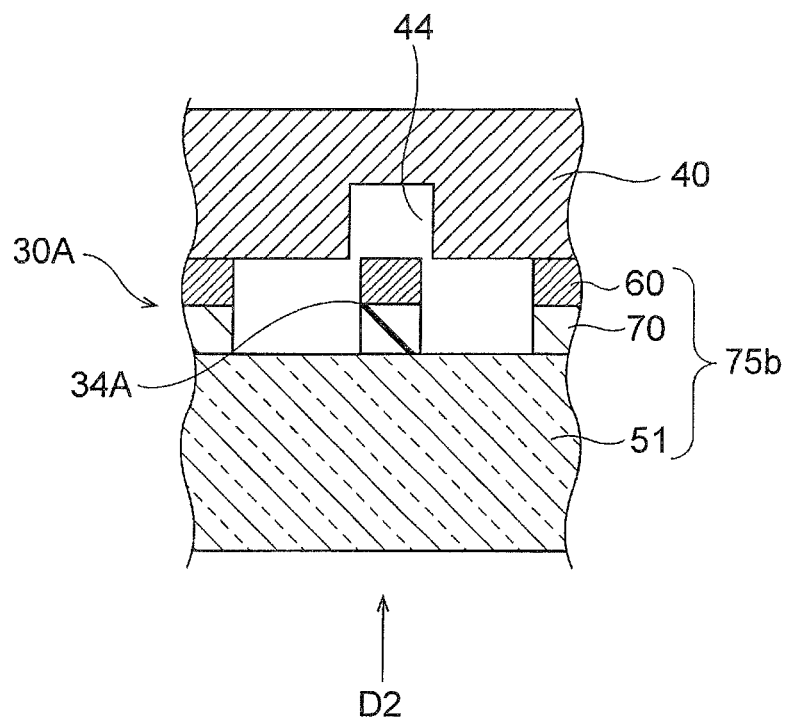
FIG. 30 is a diagram depicting a third modification of the first alignment mark and the second alignment mark according to the second embodiment.

In the embodiment described above, an exemplary case in which the second alignment mark 44 is a through-hole has been described. However, this is not limitative; as illustrated in FIG. 30, the second alignment mark 44 may be a non-through-hole which is recessed to an intermediate position in the thickness direction of the support 40 and is opening to the mask main body 30A side. The second alignment mark 44 may be formed in the support 40 by, for example, half etching (a technique for etching to an intermediate position in the thickness direction of the support 40). On the other hand, the first alignment mark 34A may be an island-like projection formed on the base material 51. The second alignment mark 44 may be similar in shape to the first alignment mark 34A in plan view. For example, in the case where the second alignment mark 44 is circular in shape in plan view, the first alignment mark 34A may have a cylindrical shape. In FIG. 30, the second alignment mark 44 is larger than the first alignment mark 34A in plan view. In this case, the alignment between the first alignment mark 34A and the second alignment mark 44 can be conducted from the side of the base material 51 which has a light-transmitting property (in the direction of arrow D2 in FIG. 30). Since the second alignment mark 44 is a non-through-hole as described above, at the time of vapor-depositing the vapor deposition material 98 onto the organic EL substrate 92, the vapor deposition material 98 does not pass through the second alignment mark 44, and, therefore, the vapor deposition material 98 would not be deposited at unrequired positions on the organic EL substrate 92.

Figure 31:
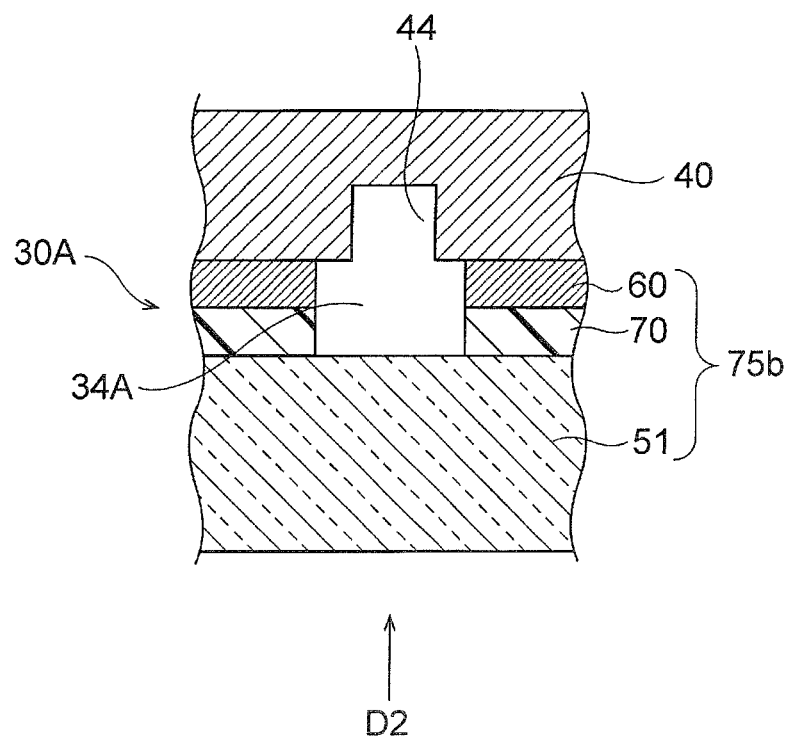
FIG. 31 is a diagram depicting a fourth modification of the first alignment mark and the second alignment mark according to the second embodiment.
Figure 32:
FIGS. 32(A) to 32(H) are sectional views depicting a modification of the method of manufacturing the vapor deposition mask according to the second embodiment.
Figure 32:
Figure 32:
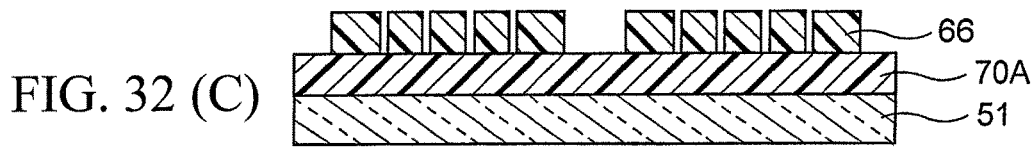
Figure 32:
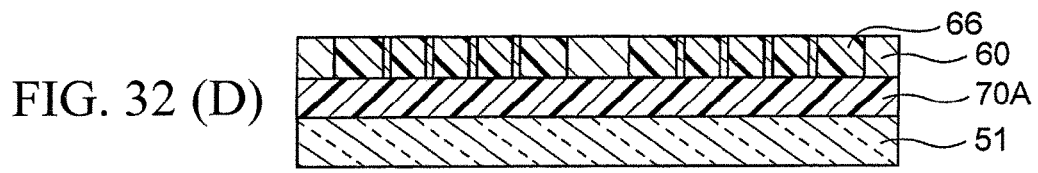
Figure 32:
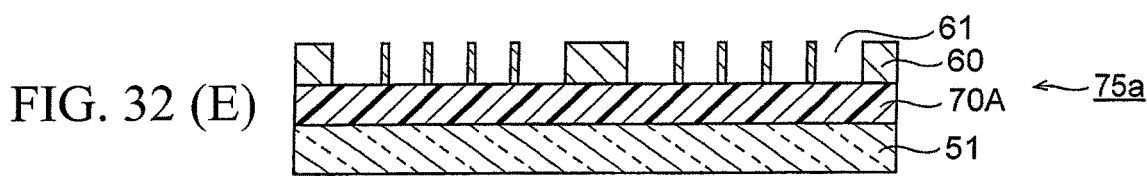
Figure 32:
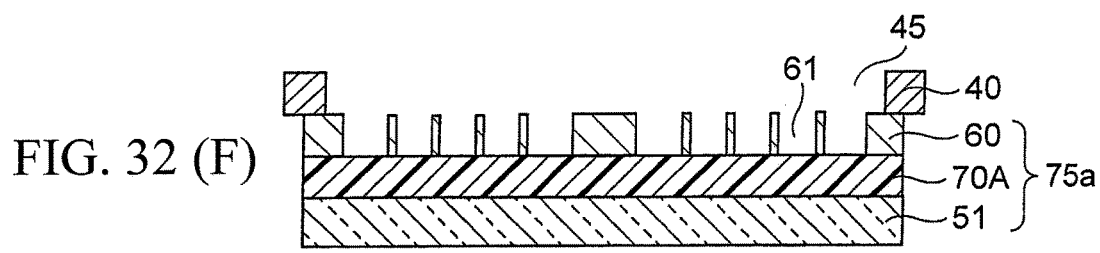
Figure 32:
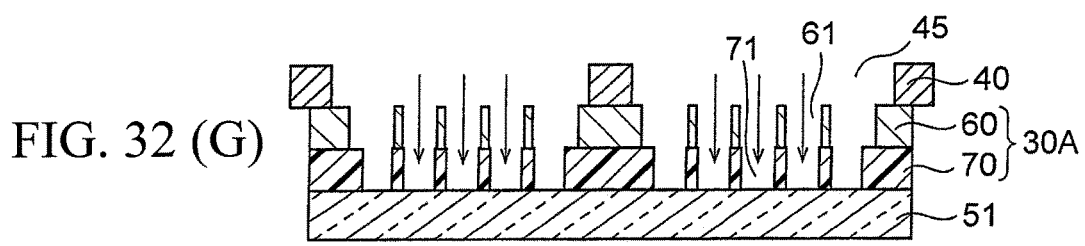
Figure 32:
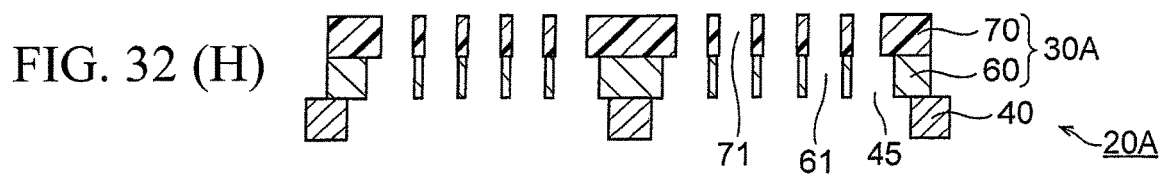

As illustrated in FIG. 31, the second alignment mark 44 may be a non-through-hole which is recessed to an intermediate position in the thickness direction of the support 40 and is opening to the mask main body 30A side, while the first alignment mark 34A may be a through-hole. The second alignment mark 44 may be formed in the support 40 by, for example, half etching (a technique for etching to an intermediate position in the thickness direction of the support 40). The shape of the second alignment mark 44 is similar to the shape of the first alignment mark 34A in plan view. In FIG. 31, the first alignment mark 34A is larger than the second alignment mark 44 in plan view. In this case, the alignment between the first alignment mark 34A and the second alignment mark 44 can be performed from the side of the base material 51 which has a light-transmitting property (in the direction of arrow D2 in FIG. 31). Since the second alignment mark 44 is a non-through-hole as described above, at the time of vapor-depositing the vapor deposition material 98 onto the organic EL substrate 92, the vapor deposition material 98 does not pass through the second alignment mark 44, and, therefore, the vapor deposition material 98 would not be deposited at unrequired positions on the organic EL substrate 92.

In the embodiment described above, an exemplary case in which the resin layer 70A is irradiated with laser to form the openings 71 and thereafter the support 40 is joined to the metallic layer 60 has been described (FIGS. 26(F) and 26(G)). However, this is not limitative; as depicted in FIGS. 32(a) to 32(h), the resin layer 70A may be irradiated with laser to form the openings 71 after the support 40 is joined to the metallic layer 60. In this case, the first alignment mark 34A may be formed as a through-hole penetrating the metallic layer 60 in its thickness direction. By aligning the first alignment mark 34A of the metallic layer 60 with the second alignment mark 44 of the support 40, the positioning of the first intermediate 57a and the support 40 can be performed accurately.

Next, various modifications of the support 40 in the first embodiment and the second embodiment mentioned above will be described referring to FIGS. 33 to 40.

Figure 33:
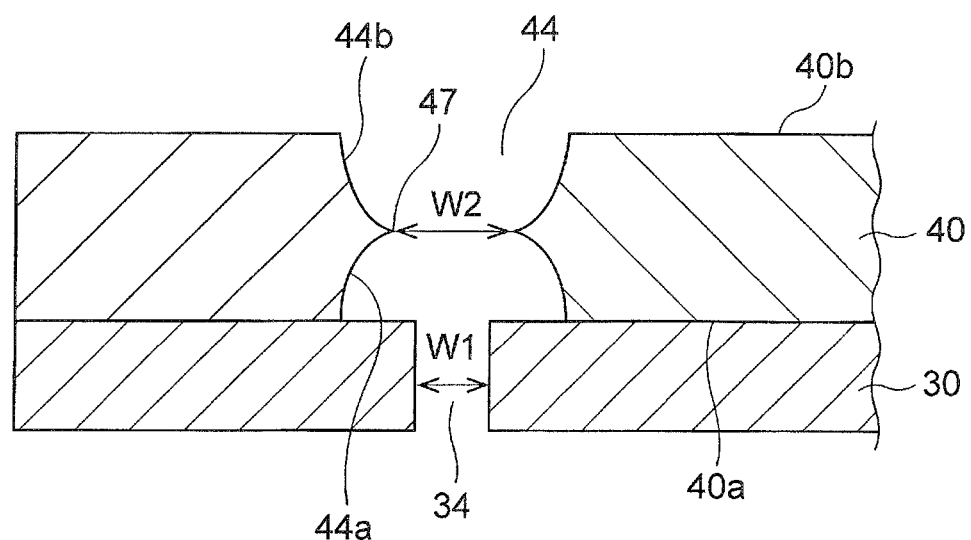
FIG. 33 is a sectional view depicting one modification of the support.

In the case where the second alignment mark 44 of the support 40 is produced by etching from both sides, as depicted in FIG. 33, the second alignment mark 44 may have such a shape that the opening area varies in the thickness direction. In this case, the support 40 may have a first surface 40a located on the mask main body 30 side, and a second surface 40b located on the side opposite to the mask main body 30. In section, the second alignment mark 44 may have a first wall section 44a on the first surface 40a side, a second wall section 44b on the second surface 40b side, and a crest section 47 located between the first wall section 44a and the second wall section 44b. The first wall section 44a and the second wall section 44b are curved surfaces. The second alignment mark 44 is the smallest in area at the crest section 47, and the diameter (width) W2 of the second alignment mark 44 is defined at the crest section 47. The crest section 47 may be located substantially at the center in the thickness direction of the support 40, and may be located at substantially the same distance from the first surface 40a and the second surface 40b. With the crest section 47 formed substantially at the center in the thickness direction of the support 40 as described above, warping of the support 40 can be reduced. The reason why the warping of the support 40 can be reduced as described above lies in that in the case where the support 40 is formed by etching a rolled material, the rolled material has a residual stress due to the rolling step, but, when the rolled material is uniformly etched from the face side and the back side, the parts having the residual stress can be removed uniformly. In the case of nonuniform etching from the face side and the back side, for example, in the support 40 of FIG. 34 to be described later, the etching amount on the first surface 40a side is smaller, and the residual stress on the first surface 40a side is larger, so that warping of the support 40 may occur depending on conditions.

Figure 34:
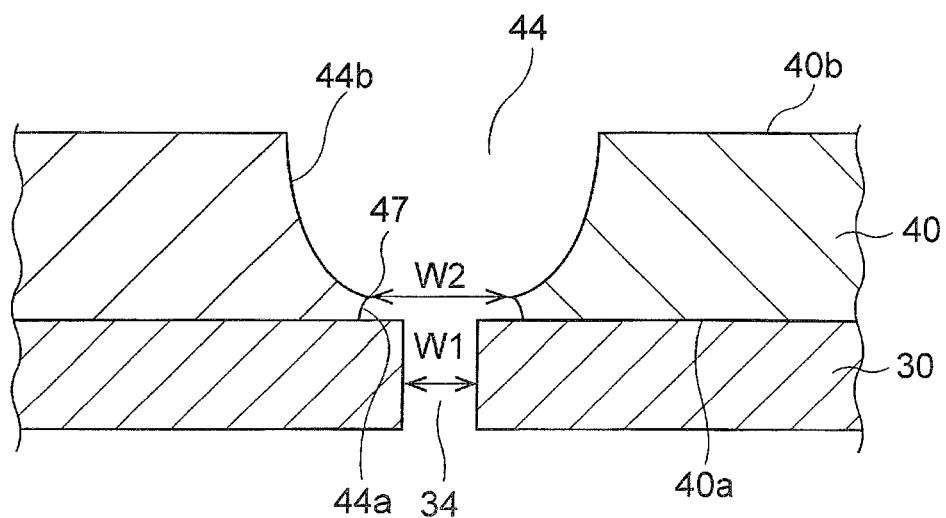
FIG. 34 is a sectional view depicting one modification of the support.

As depicted in FIG. 34, in section, the crest section 47 may be located at a position deviated from a substantial center in the thickness direction of the support 40. Specifically, the crest section 47 may be located on the first surface 40a side as compared to the substantial center in the thickness direction of the support 40. In this case, a through-hole constituting the second alignment mark 44 is wider on the second surface 40b side than on the first surface 40a side. The second alignment mark 44 is the narrowest in area at the crest section 47, and the diameter (width) W2 of the second alignment mark 44 is defined at the crest section 47. In this case, the diameter (width) W2 of the second alignment mark 44 can be formed with high accuracy, and the accuracy of alignment between the mask main body 30 and the support 40 can be enhanced. The reason is as follows. Specifically, in the case of forming a through-hole (second alignment mark 44) by etching the support 40 from both the face and back sides, a recess is formed from the first surface 40a side (first etching; smaller hole), the recess is filled with a resin, and the through-hole is formed by second etching (larger hole) from the second surface 40b side. In this instance, the diameter (width) W2 of the second alignment mark 44 is predominated by the first etching, and, therefore, accuracy can be secured easily.

Figure 35:
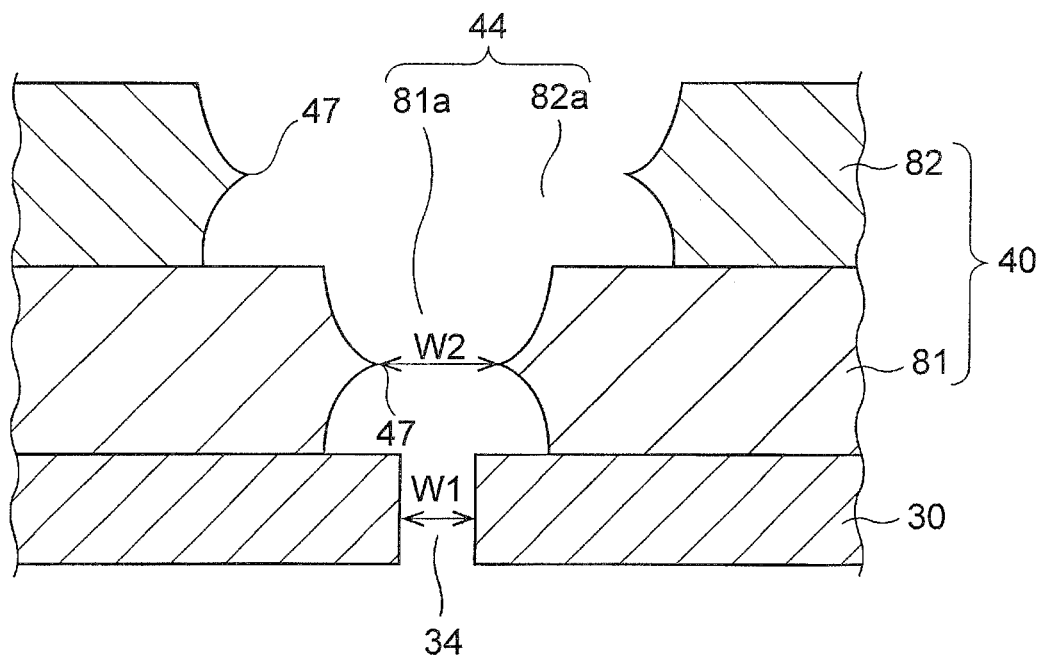
FIG. 35 is a sectional view depicting one modification of the support.

As illustrated in FIG. 35, the support 40 may include a first support substrate 81 located on the mask main body 30 side, and a second support substrate 82 located on the first support substrate 81. The first support substrate 81 and the second support substrate 82 may be stacked on each other. By this, the thickness of the support 40 can be increased, for example, to a value of equal to or more than 300 μm. For example, in the case where stress in the mask main body 30 is large, such as the case where the mask main body 30 includes a plating layer or a resin layer, thickening of the support 40 makes it possible to prevent deformation of the vapor deposition mask 20. By adhering the separately prepared first support substrate 81 and second support substrate 82 to each other, productivity of the support 40 can be enhanced. In the case where the support 40 includes two or more layers, the thickness of each of the layers constituting the support 40 (for example, the first support substrate 81 and the second support substrate 82) can be reduced. In this case, in each of the layers constituting the support 40, the etching step for forming the through-hole (for example, a first portion 81a and a second portion 82a) can be carried out in a shorter period of time. Therefore, productivity in producing the support 40 can be enhanced.

In FIG. 35, the second alignment mark 44 includes the first portion 81a of the first support substrate 81 and the second portion 82a of the second support substrate 82. The first portion 81a is smaller than the second portion 82a in plan view. The first portion 81a and the second portion 82a of the second alignment mark 44 may each have a sectional shape substantially similar to the sectional shape of the second alignment mark 44 depicted in FIG. 33. The diameter (width) W2 of the second alignment mark 44 is defined at the crest section 47 of the second portion 82a. Since the first portion 81a of the second alignment mark 44 is smaller than the second portion 82a as describe above, it is ensured that at the time of producing the support 40 by stacking the first support substrate 81 and the second support substrate 82 on each other, alignment between the first portion 81a and the second portion 82a can be facilitated. With the crest section 47 of the first portion 81a and the crest section 47 of the second portion 82a formed at substantial centers in the thickness direction, warping of the first support substrate 81 and the second support substrate 82 can be reduced.

The first support substrate 81 and the second support substrate 82 may have the same thickness, or either one of them may be thicker than the other of them. For example, the first support substrate 81 may be thinner than the second support substrate 82. By this, the first portion 81a smaller than the second portion 82a in plan view can be produced easily. It is to be noted that the first support substrate 81 may be thicker than the second support substrate 82.

Figure 36:
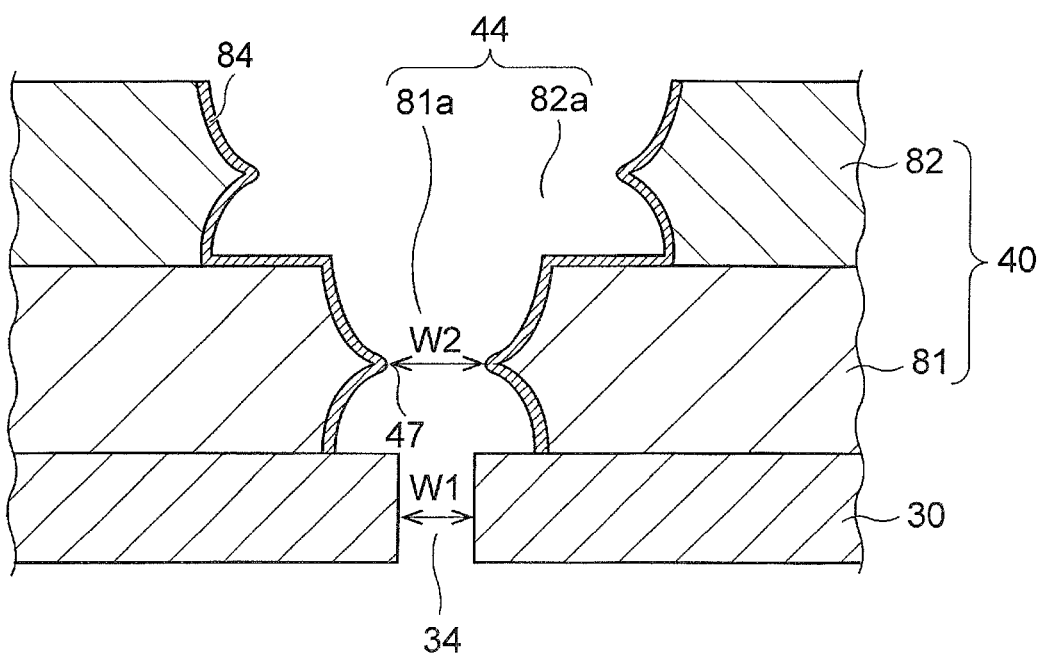
FIG. 36 is a sectional view depicting one modification of the support.

The first support substrate 81 and the second support substrate 82 may be joined to each other by welding. Alternatively, the first support substrate 81 and the second support substrate 82 may be joined to each other by an adhesive. In this case, as depicted in FIG. 36, an inner wall surface of the first portion 81a and an inner wall surface of the second portion 82a may be covered with a plating layer 84. This ensures that at the time of pressure reduction in a vapor deposition step using the vapor deposition mask 20, a monomer remaining in the adhesive can be prevented from being released from between the first support substrate 81 and the second support substrate 82.

Figure 37:
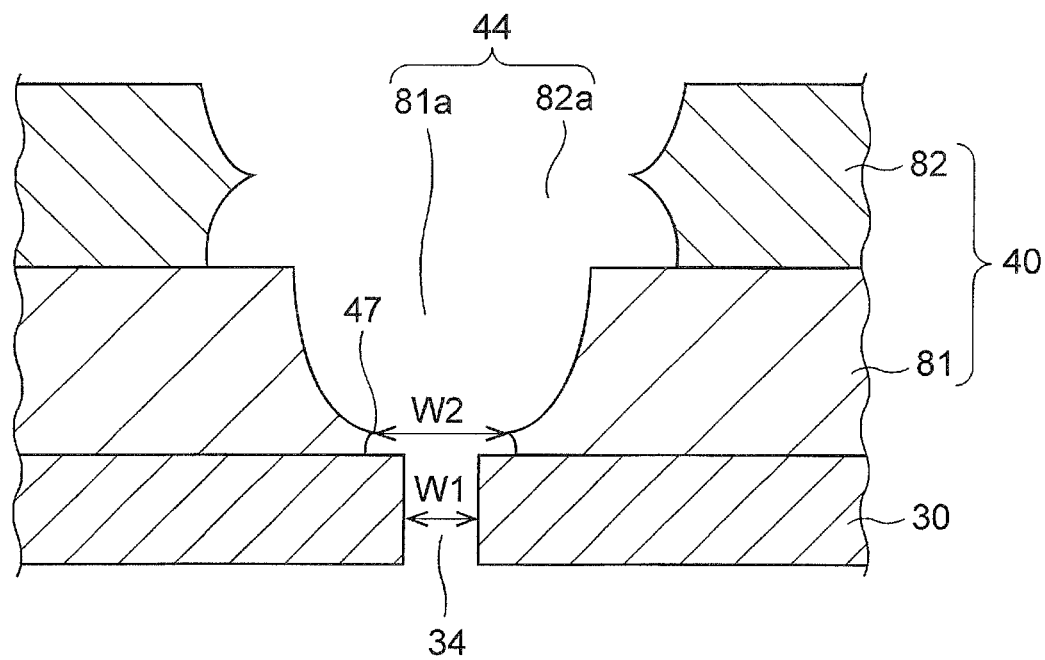
FIG. 37 is a sectional view depicting one modification of the support.

As illustrated in FIG. 37, the support 40 may include a first support substrate 81 located on the mask main body 30 side, and a second support substrate 82 located on the first support substrate 81. The second alignment mark 44 may include a first portion 81a of the first support substrate 81 and a second portion 82a of the second support substrate 82, and the first portion 81a may be smaller than the second portion 82a in plan view. The first portion 81a may have a sectional shape substantially similar to the sectional shape of the second alignment mark 44 depicted in FIG. 34, while the second portion 82a may have a sectional shape substantially similar to the sectional shape of the second alignment mark 44 depicted in FIG. 33. The crest section 47 of the first portion 81a may be located on the mask main body 30 side as compared to a substantial center in the thickness direction of the first support substrate 81. In this case, the diameter (width) W2 of the second alignment mark 44 can be formed with high accuracy, and the accuracy of alignment between the mask main body 30 and the support 40 can be enhanced.

Figure 38:
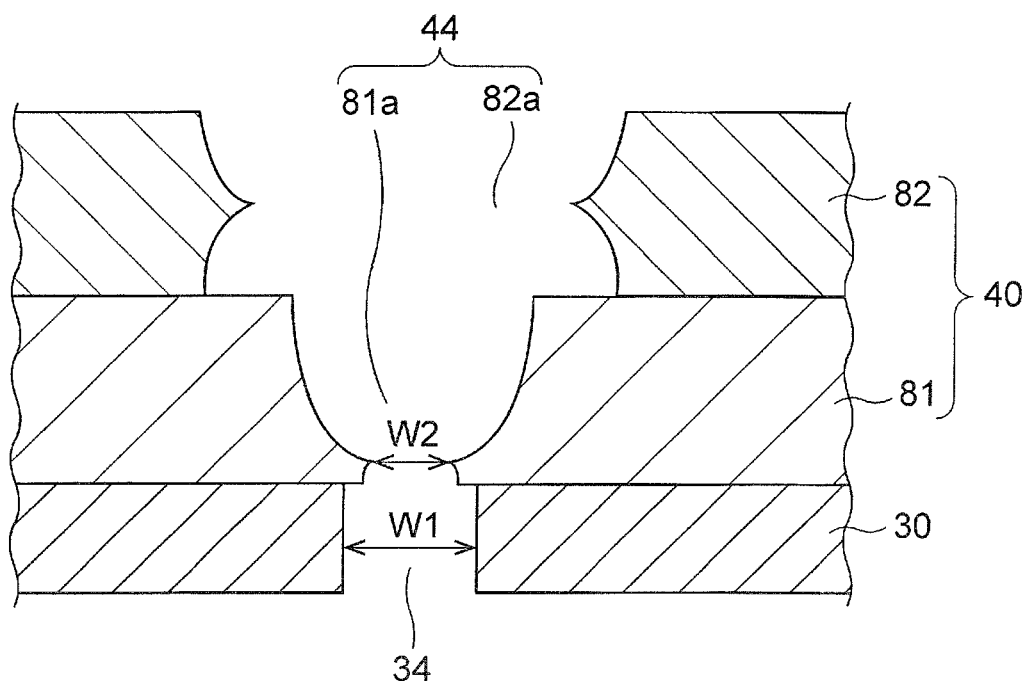
FIG. 38 is a sectional view depicting one modification of the support.

In FIG. 37, the diameter (width) W2 of the second alignment mark 44 is larger than the diameter (width) W1 of the first alignment mark 34 (W2>W1), but this is not limitative; as depicted in FIG. 38, the diameter (width) W2 of the second alignment mark 44 may be smaller than the diameter (width) W1 of the first alignment mark 34 (W2<W1).

Figure 39:
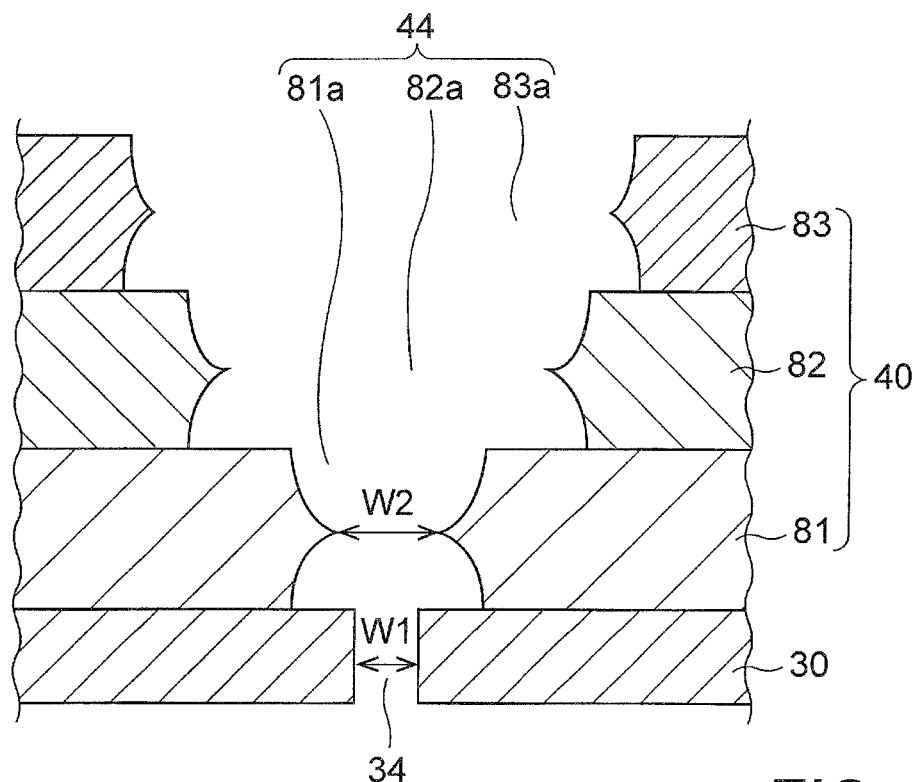
FIG. 39 is a sectional view depicting one modification of the support.
Figure 40:
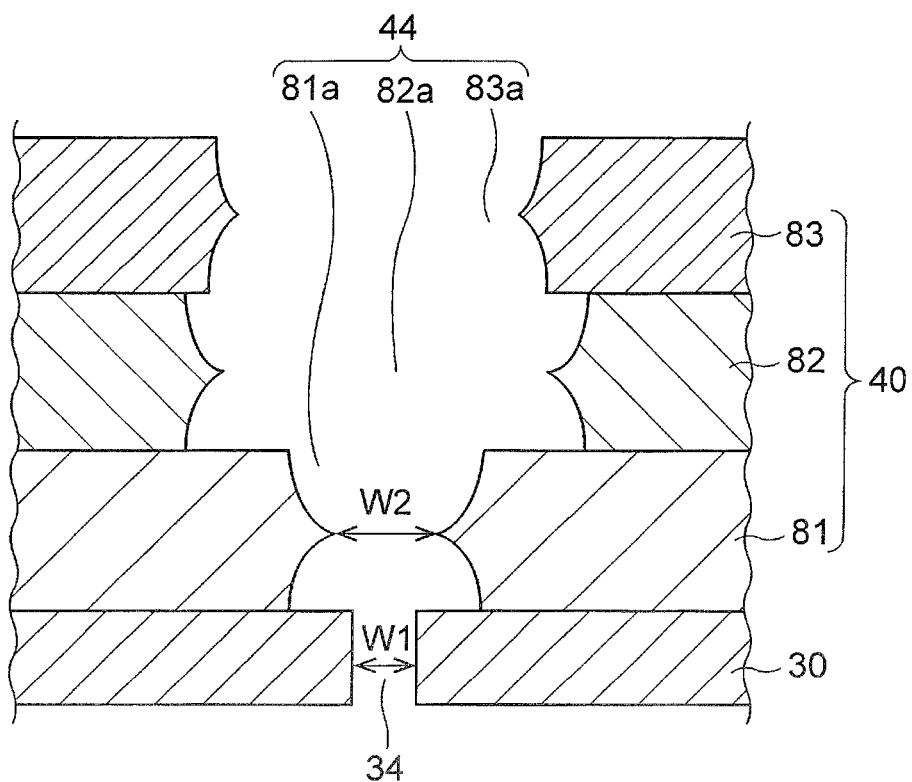
FIG. 40 is a sectional view depicting one modification of the support.

As depicted in FIG. 39, the support 40 may include three layers of support substrates. In this case, the support 40 may include a first support substrate 81 located on the mask main body 30 side, a second support substrate 82 located on the first support substrate 81, and a third support substrate 83 located on the second support substrate 82. The first support substrate 81, the second support substrate 82, and the third support substrate 83 may be stacked on one another. By this, the thickness of the support 40 can further be enlarged. In addition, deformation of the vapor deposition mask 20 can be restrained. By adhering the separately prepared first support substrate 81, second support substrate 82, and third support substrate 83 to one another, productivity of the support 40 can be enhanced.

In FIG. 39, the second alignment mark 44 includes a first portion 81a of the first support substrate 81, a second portion 82a of the second support substrate 82, and a third portion 83a of the third support substrate 83. The first portion 81a may be smaller than the second portion 82a in plan view. The third portion 83a may be larger than the first portion 81a in plan view. The third portion 83a may be larger than the second portion 82a in plan view (see FIG. 39), or may be smaller than the second portion 82a in plan view (see FIG. 40). It is to be noted that, though not illustrated, the support 40 may include four or more layers of support substrates.

The plurality of constituent elements disclosed in the above embodiments and modifications may appropriately be combined, as required. Alternatively, some constituent elements may be omitted from all the constituent elements described in the above embodiments and modifications.

The invention claimed is:

1. A vapor deposition mask device comprising:
a mask main body;
a support joined to the mask main body; and
a frame joined to the support, wherein the mask main body includes an effective region in which a first through-hole is formed, wherein the support includes a second through-hole that overlaps the first through-hole, and wherein the second through-hole is larger than the effective region, wherein the mask main body has a first alignment mark, wherein the support has a second alignment mark, and wherein the first alignment mark and the second alignment mark are provided at positions that overlap each other in plan view, and wherein either one of the first and second alignment marks is larger than the other one of the first and second alignment marks.

2. The vapor deposition mask device according to claim 1, wherein the mask main body has a plating layer formed with a plurality of first through-holes.

3. The vapor deposition mask device according to claim 1, wherein the mask main body has a metallic layer and a resin mask stacked on each other.

4. The vapor deposition mask device according to claim 1, wherein the first alignment mark is a through-hole formed in the mask main body.

5. The vapor deposition mask device according to claim 1, wherein the second alignment mark is a through-hole formed in the support.

6. The vapor deposition mask device according to claim 1, wherein the second alignment mark is a non-through-hole recessed to an intermediate position in a thickness direction of the support.

7. The vapor deposition mask device according to claim 1, wherein the support includes a first support substrate located on the mask main body side and a second support substrate located on the first support substrate, wherein the second alignment mark includes a first portion of the first support substrate and a second portion of the second support substrate, and wherein the first portion is smaller than the second portion in plan view.

8. A method of manufacturing a vapor deposition mask device, the method comprising:

preparing an intermediate including a substrate and a mask main body joined to the substrate;

joining the mask main body and a support to each other; and mounting a frame to the support wherein the mask main body includes an effective region in which a first through-hole is formed, wherein the support includes a second through-hole that overlaps the first through-hole, and wherein the second through-hole is larger than the effective region, wherein the mask main body has a first alignment mark, wherein the support has a second alignment mark, wherein the first alignment mark and the second alignment mark are provided at positions that overlap each other in plan view, and wherein either one of the first and second alignment marks is larger than the other one of the first and second alignment marks, and wherein in the joining the mask main body and the support to each other, positioning of the mask main body and the support is performed by mutually aligning the positions of the first alignment mark and the second alignment mark.

9. A vapor deposition method for a vapor deposition material for vapor-depositing the vapor deposition material onto a substrate, the vapor deposition method comprising:

preparing the vapor deposition mask device according to claim 1;

preparing the substrate;

disposing the substrate on the mask main body of the vapor deposition mask device; and vapor-depositing the vapor deposition material onto the substrate disposed on the mask main body.

10. A method of manufacturing an organic electroluminescent (EL) display device, the method comprising forming a vapor deposition pattern on an object of vapor deposition by use of the vapor deposition device according to claim 1.

11. A vapor deposition method for a vapor deposition material for vapor-depositing the vapor deposition material onto a substrate, the vapor deposition method comprising:

preparing the vapor deposition mask device according to claim 1;

preparing the substrate;

disposing the substrate on the mask main body of the vapor deposition mask device; and vapor-depositing the vapor deposition material onto the substrate disposed on the mask main body.

* * * * *